US011894428B2

(12) United States Patent
Hatta et al.

(10) Patent No.: US 11,894,428 B2
(45) Date of Patent: Feb. 6, 2024

(54) SILICON CARBIDE SEMICONDUCTOR DEVICE AND POWER CONVERTER

(71) Applicant: Mitsubishi Electric Corporation, Tokyo (JP)

(72) Inventors: Hideyuki Hatta, Tokyo (JP); Rina Tanaka, Tokyo (JP); Katsutoshi Sugawara, Tokyo (JP); Yutaka Fukui, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 412 days.

(21) Appl. No.: 17/427,090

(22) PCT Filed: Mar. 18, 2019

(86) PCT No.: PCT/JP2019/011112
§ 371 (c)(1),
(2) Date: Jul. 30, 2021

(87) PCT Pub. No.: WO2020/188686
PCT Pub. Date: Sep. 24, 2020

(65) Prior Publication Data
US 2022/0102503 A1 Mar. 31, 2022

(51) Int. Cl.
*H01L 29/16* (2006.01)
*H01L 29/872* (2006.01)

(52) U.S. Cl.
CPC ........ *H01L 29/1608* (2013.01); *H01L 29/872* (2013.01)

(58) Field of Classification Search
CPC ............... H01L 29/1608; H01L 29/872; H01L 29/0696; H01L 29/0878; H01L 29/0623;
(Continued)

(56) References Cited

U.S. PATENT DOCUMENTS 11,271,084 B2\* 3/2022 Fukui ................. H01L 29/7806
2009/0283776 A1 11/2009 Iwamuro
(Continued)

FOREIGN PATENT DOCUMENTS

JP 2006-210392 A 8/2006
JP 2009-278067 A 11/2009

OTHER PUBLICATIONS

International Search Report and Written Opinion dated May 11, 2019, received for PCT Application PCT/JP2019/011112, Filed on Mar. 18, 2019, 6 pages including English Translation.

*Primary Examiner* — Allison Bernstein
(74) *Attorney, Agent, or Firm* — XSENSUS LLP

(57) ABSTRACT

The present invention relates to a silicon carbide semiconductor device that includes a Schottky barrier diode in a field-effect transistor and includes a first trench provided through first and second semiconductor regions in a thickness direction and reaches inside a semiconductor layer, a second trench provided through the second semiconductor region in the thickness direction and reaches inside the semiconductor layer, a gate electrode embedded in the first trench via a gate insulating film, a Schottky barrier diode electrode embedded in the second trench, a first low-resistance layer having contact with a trench side wall of the first trench, and a second low-resistance layer having contact with a trench side wall of the second trench. The second low-resistance layer has an impurity concentration that is higher than the impurity concentration in the semiconductor layer and lower than the impurity concentration in the first low-resistance layer.

16 Claims, 21 Drawing Sheets

(58) Field of Classification Search
CPC . H01L 21/047; H01L 29/417; H01L 29/6606; H01L 29/66068; H01L 29/7806; H01L 29/78
See application file for complete search history.

(56) References Cited

U.S. PATENT DOCUMENTS

| | | | |
|---|---|---|---|
| 2022/0037474 A1* | 2/2022 | Tanaka | H01L 29/66068 |
| 2023/0215942 A1* | 7/2023 | Tanaka | H01L 29/66477 257/334 |
| 2023/0290874 A1* | 9/2023 | Yoshida | H01L 29/7806 257/77 |

* cited by examiner

F I G. 9
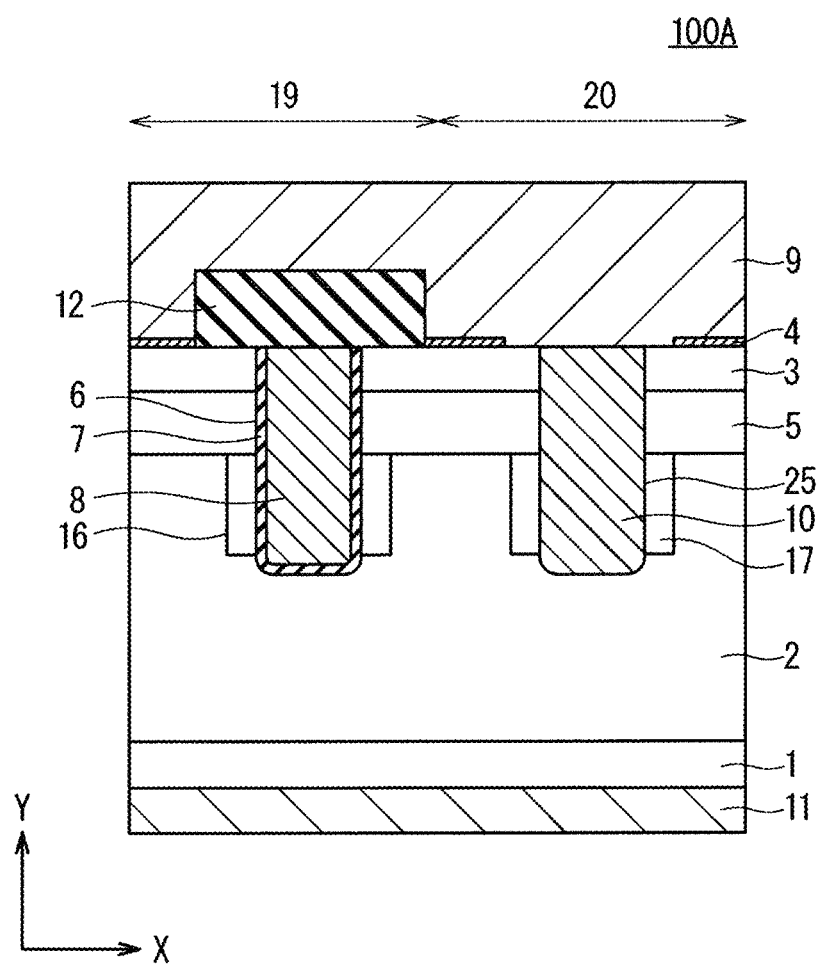

F I G. 1 0
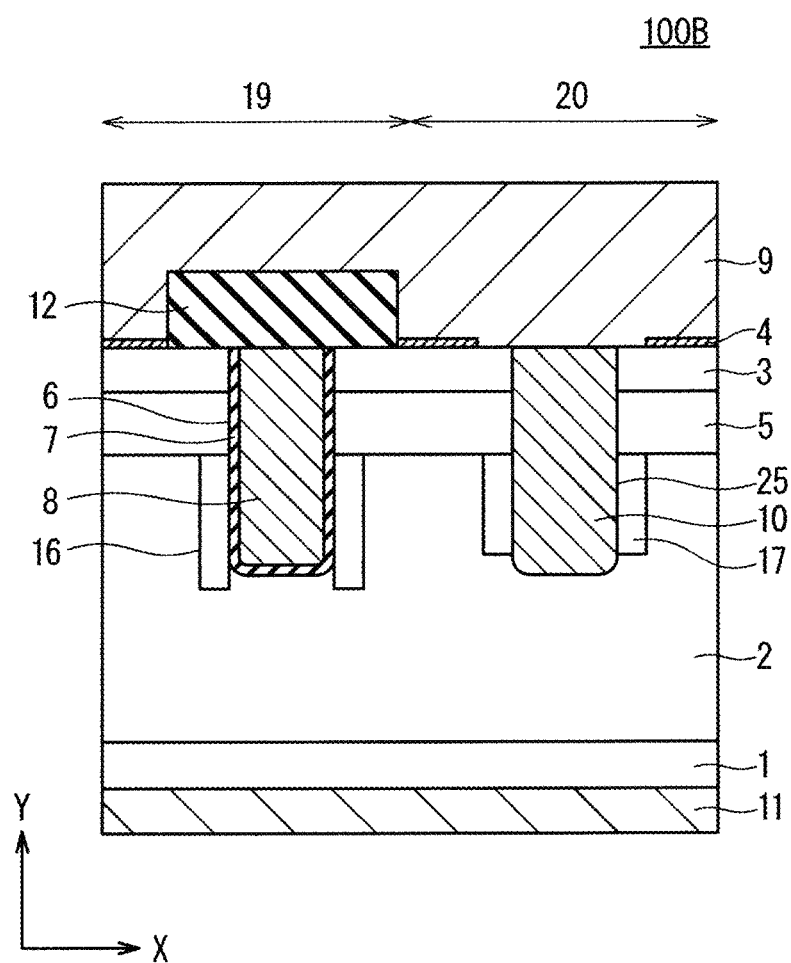

F I G. 1 4
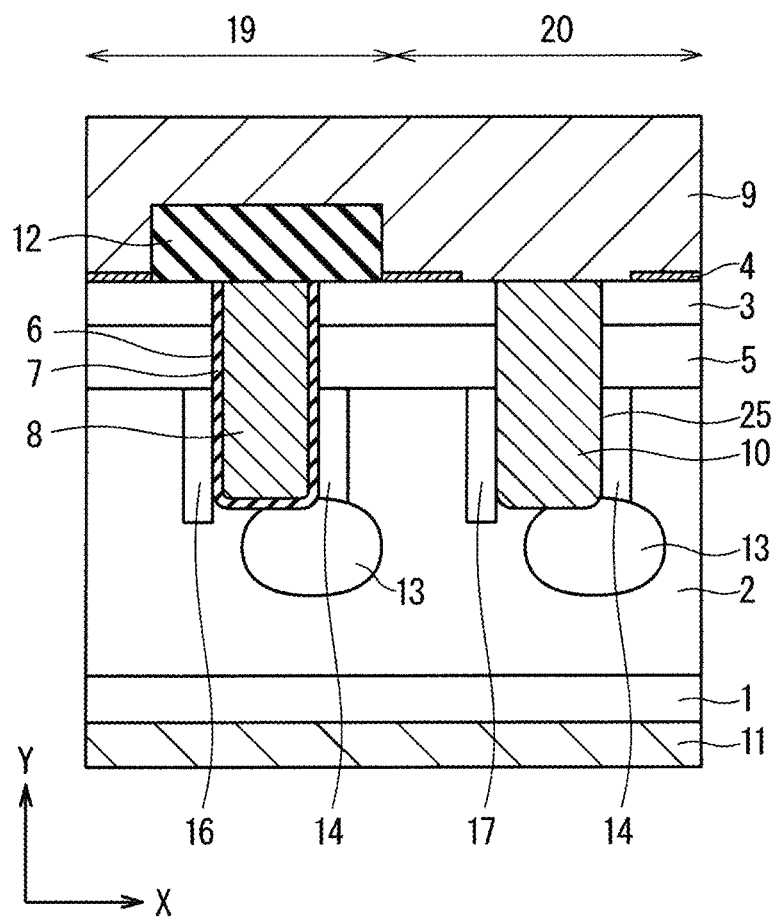

F I G. 1 5
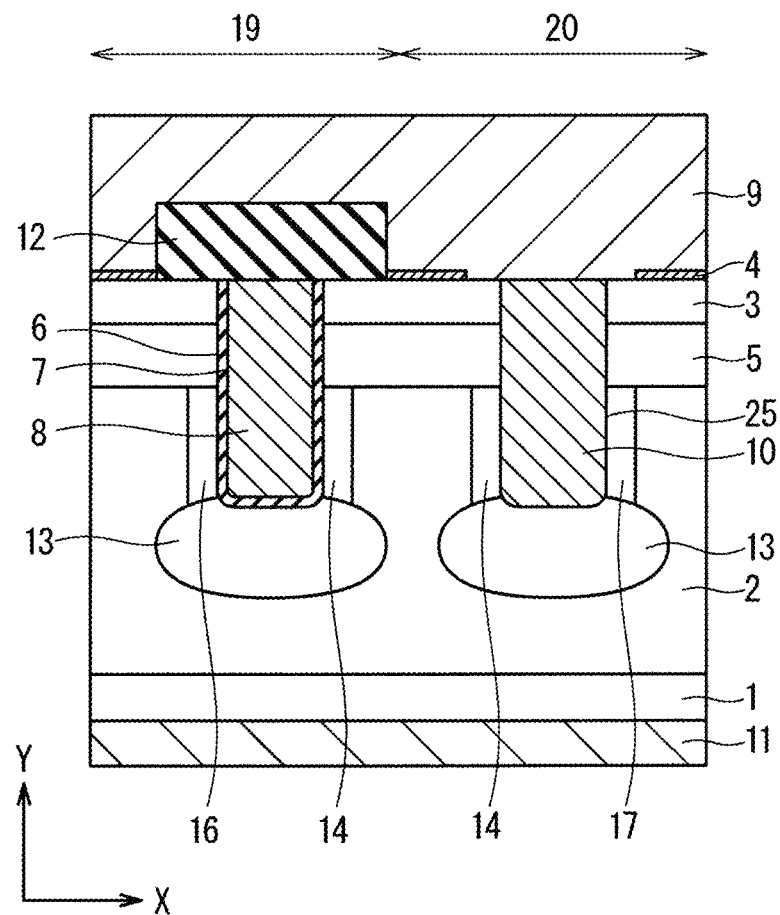

F I G. 1 9
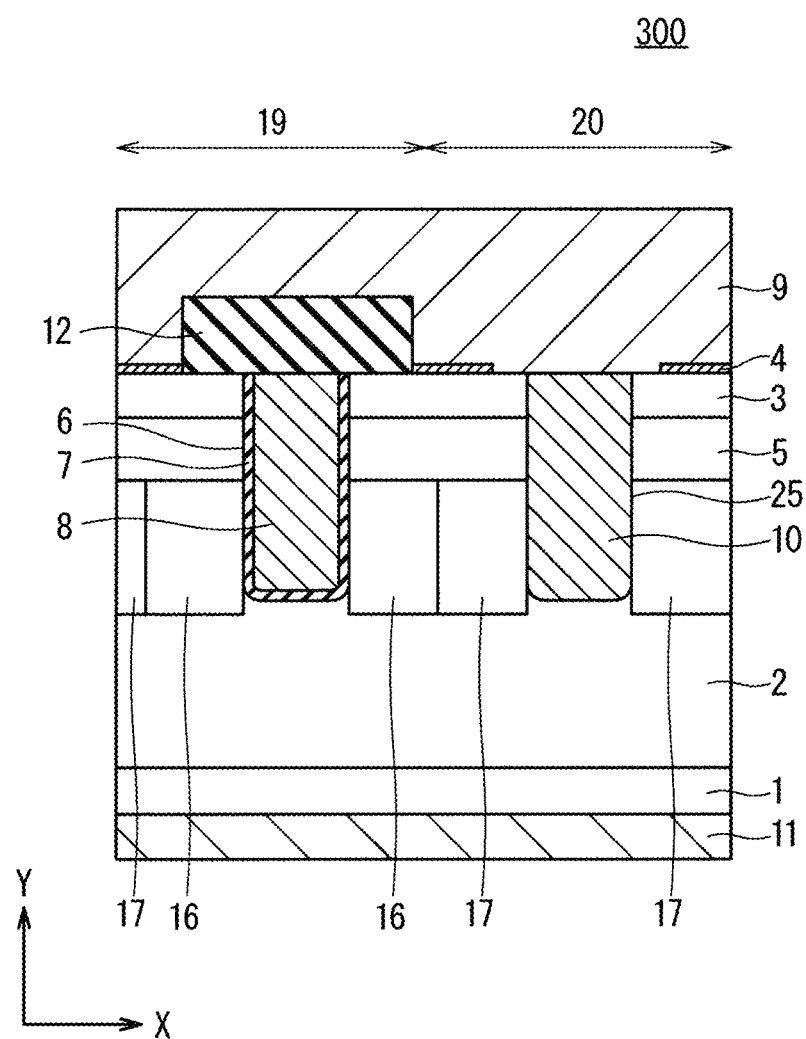

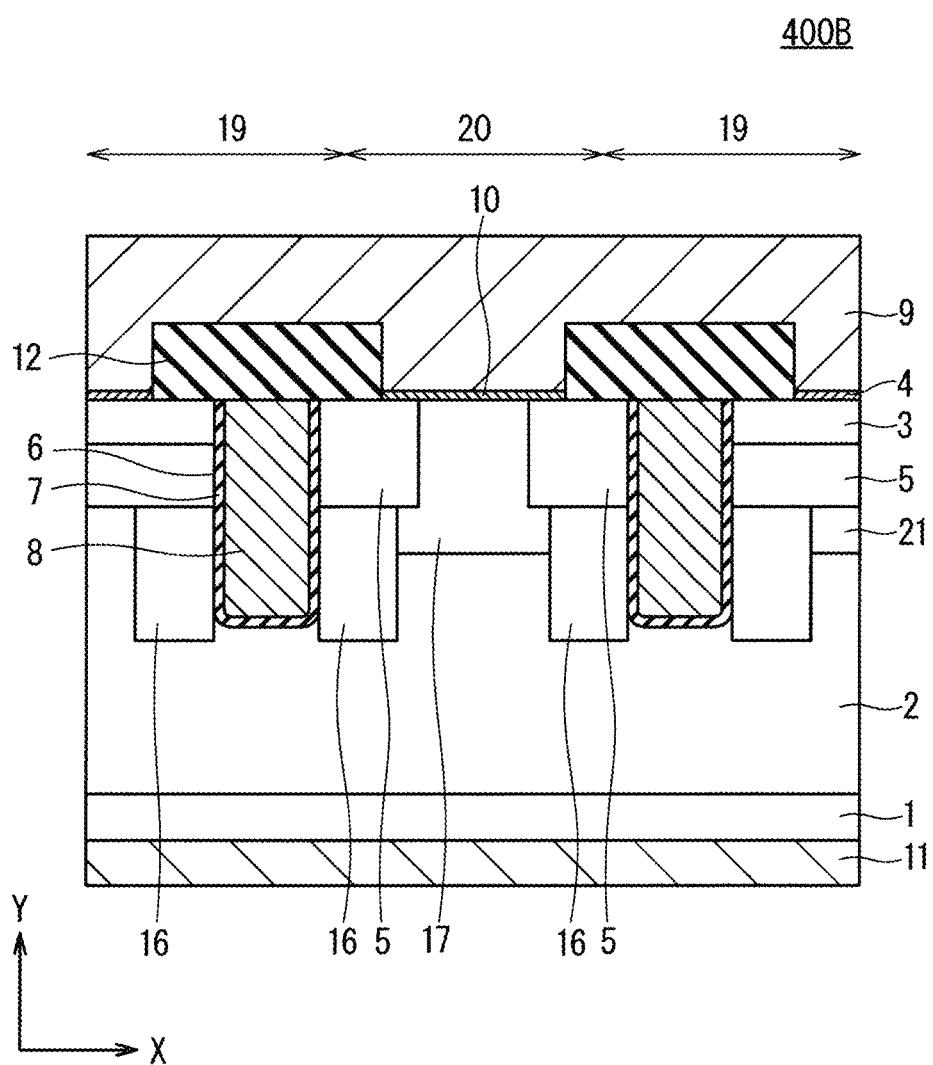
F I G. 2 2

F I G. 2 3
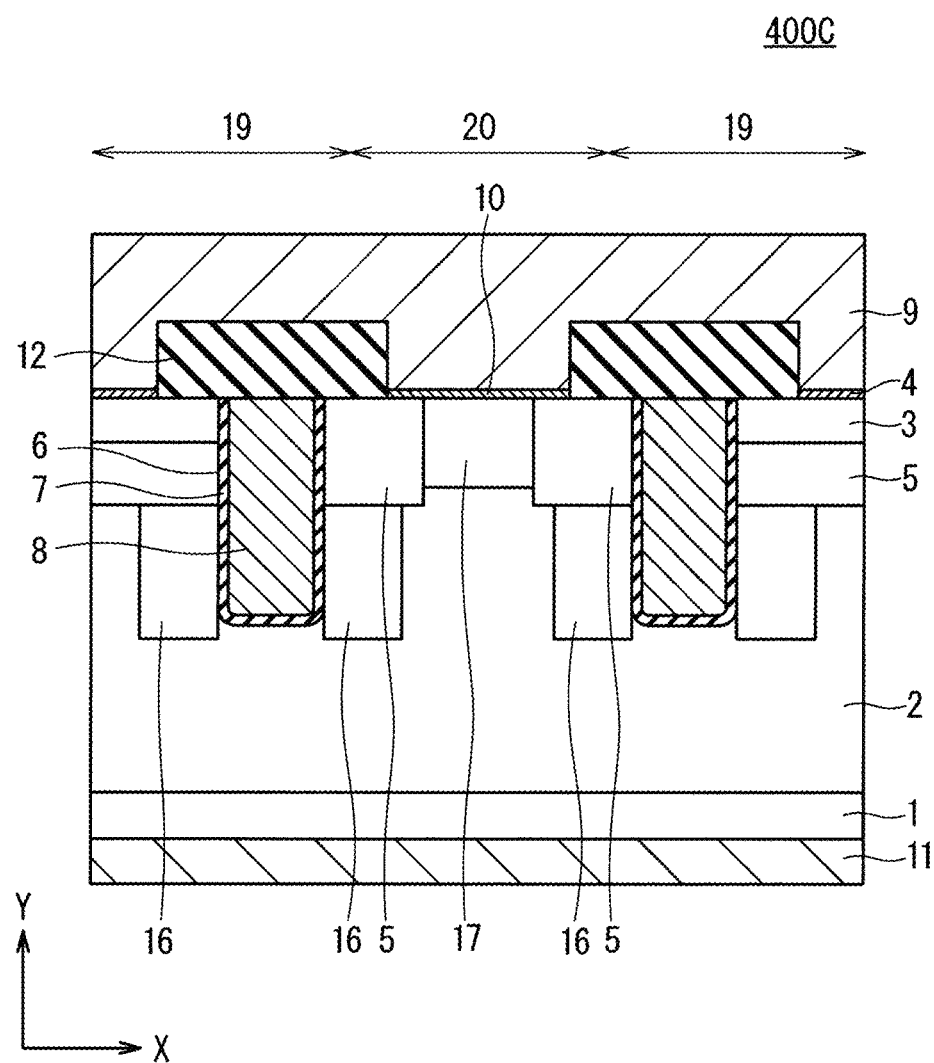

SILICON CARBIDE SEMICONDUCTOR DEVICE AND POWER CONVERTER

CROSS-REFERENCE TO RELATED APPLICATION

The present application is based on PCT filing PCT/JP2019/011112, filed Mar. 18, 2019, the entire contents of which is incorporated herein by reference.

TECHNICAL FIELD

The present invention relates to a silicon carbide semiconductor device and in particular to a silicon carbide semiconductor device that includes trench gates.

BACKGROUND ART

A configuration is known in which a unipolar semiconductor device such as a metal oxide semiconductor field effect transistor (MOSFET) for use as a power switching element includes a Schottky barrier diode (SBD) serving as a unipolar freewheeling diode.

This configuration is achieved by arranging, in parallel, MOSFET cells including gate electrodes and SBD cells including Schottky electrodes. As one example of general configurations, there is a configuration in which a Schottky electrode is provided in a predetermined region of a semiconductor chip, and this region is caused to operate as a Schottky barrier diode.

This configuration can reduce costs as compared to the case of using individual diodes externally mounted on a semiconductor chip. Besides, the fact that the inclusion of Schottky barrier diodes suppresses bipolar operation of parasitic pn diodes becomes a merit of an MOSFET that uses silicon carbide as a base material. This is because a silicon carbide semiconductor device may suffer a phenomenon of extended crystal defects resulting from the recombination energy of carriers generated by bipolar operation of parasitic pn diodes, and accordingly may impair its reliability as a switching element.

In the case where a trench-gate MOSFET includes Schottky barrier diodes, a configuration is conceivable in which some gate electrodes are replaced by Schottky electrodes and connected to source electrodes as disclosed in, for example, Patent Document 1. This configuration keeps the distances between the trenches small and accordingly makes it possible to obtain high Schottky current from built-in SBD regions while maintaining low electric fields at the bottoms of the trenches.

In a semiconductor device such as a trench-gate MOSFET that include gate electrodes inside trenches, channels are formed in the side walls of the trenches. This configuration has the merit of being able to improve the density of channel widths and reduce ON-state resistance as compared to those of a planar MOSFET that has gate electrodes formed on the device surface. There is, however, a problem in that the concentration of electric fields occurs at the bottoms of the trenches when a high voltage is applied in the OFF state of the semiconductor device. In particular, in a trench-gate silicon carbide semiconductor device, SiC has high breakdown strength and therefore the breakdown of a gate insulating film due to the concentration of electric fields at the bottoms of the trenches tends to occur prior to the occurrence of avalanche breakdown in a drift layer. Thus, the concentration of electric fields at the bottoms of the trenches is liable to be a problem.

In order to moderate the concentration of electric fields at the bottoms of the trenches, it has been proposed to provide a protective layer having a different conductive type from that of the drift layer in the trenches. For example, as disclosed in Patent Document 2, the concentration of electric fields at the bottoms of the trenches can be moderated by providing a trench-bottom protective layer on the drift layer provided in lower portions of the trenches. Note that the effect of moderating electric fields diminishes as the intervals between the trenches or the distances between the protective layers increase, and in this case, the intensity of electric fields applied to the bottoms of the protective layers and the gate insulating film at the bottoms of the trenches increases. This results in deterioration in reliability and withstand voltage of the gate insulating film. Accordingly, it generally becomes important to keep the distances between trenches small in a trench-gate silicon carbide semiconductor device.

PRIOR ART DOCUMENT

Patent Documents

Patent Document 1: Japanese Patent Application Laid-Open No. 2009-278067
Patent Document 2: Japanese Patent Application Laid-Open No. 2006-210392

SUMMARY

Problem to be Solved by the Invention

In the case where an SBD region is formed between MOSFET regions as in the trench-gate MOSFETs disclosed in Patent Documents 1 and 2, SBD current flows between trench gates. At this time, if the intervals between the trench gates are designed to be as narrow as possible in order to moderate electric fields, the current path may become narrow and may not allow a sufficient amount of unipolar current to flow therethrough. Therefore, it may become difficult to obtain a sufficient effect of suppressing bipolar operation of parasitic pn diodes.

In view of this, it is conceivable to increase unipolar current flowing through SBDs and an MOSFET by increasing impurity concentrations in regions between trenches. This, however, increases in return an electric field at a gate oxide film in gate trenches and SiC electric fields at the interfaces between the SBDs and the SiC regions, and may become a cause of increasing leakage current in the OFF state of the MOSFET or deteriorating long-term reliability of the MOSFET.

The electric field applied to the gate oxide film can be moderated by increasing the thickness of the gate oxide film, although there is a tradeoff relationship between the ON-state resistance and leakage current of the MOSFET. On the other hand, it is difficult to moderate the SiC electric fields at the interfaces between the SBDs and the SiC regions because the SiC electric fields cannot be controlled by control of film thickness or other parameters. When the MOSFET is OFF state, highest electric fields are detected in the vicinity of the interfaces between the SBDs and the SiC regions, except at pn junctions. This becomes a factor of failure in withstand voltage.

The present invention has been made in order to solve the problems as described above, and it is an object of the present invention to provide a silicon carbide semiconductor device capable of improving a trade-off between the ON-state resistance and leakage current of an MOSFET and suppressing bipolar operation by increasing unipolar current flowing through SBDs.

Means to Solve the Problem

A silicon carbide semiconductor device according to the present invention is a silicon carbide semiconductor device that includes a Schottky barrier diode in a field-effect transistor. The silicon carbide semiconductor device includes semiconductor layer of a first conductivity type, a first semiconductor region of the first conductivity type provided in an upper layer portion of the semiconductor layer, a second semiconductor region of a second conductivity type provided in contact with a bottom face of the first semiconductor region, a first trench provided through the first semiconductor region and the second semiconductor region in a thickness direction and having a bottom face that reaches inside the semiconductor layer, a gate electrode embedded in the first trench via a gate insulating film that covers an inner face of the first trench, an interlayer insulation film having a contact portion above the first semiconductor region, a first low-resistance layer of the first conductivity type provided in the semiconductor layer to have contact with at least one trench side wall of the first trench in a direction perpendicular to a direction of extension of the first trench, a second trench provided through the second semiconductor region in the thickness direction and having a bottom face that reaches inside the semiconductor layer, a Schottky barrier diode electrode embedded in the second trench, a second low-resistance layer of the first conductivity type provided in the semiconductor layer to have contact with at least one trench side wall of the second trench in a direction perpendicular to a direction perpendicular to a direction parallel to a direction of extension of the second trench, a first main electrode embedded in the contact portion and covering the interlayer insulation film, and a second main electrode provided on a main surface of the semiconductor layer on a side opposite to a side on which the first main electrode is provided. The second low-resistance layer has an impurity concentration higher than an impurity concentration in the semiconductor layer and lower than an impurity concentration in the first low-resistance layer.

Effects of the Invention

The silicon carbide semiconductor device according to the present invention is capable of suppressing the ON-state resistance of a field-effect transistor as well as leakage current flowing therethrough and improving the density of unipolar current flowing through built-in Schottky barrier diodes.

BRIEF DESCRIPTION OF DRAWINGS

FIG. 9 is a partial sectional view illustrating a configuration of Variation 1 of the silicon carbide semiconductor device according to Embodiment 1 of the present invention.

FIG. 10 is a partial sectional view illustrating a configuration of Variation 2 of the silicon carbide semiconductor device according to Embodiment 1 of the present invention.

FIG. 11 is a partial sectional view illustrating a configuration of Variation 3 of the silicon carbide semiconductor device according to Embodiment 1 of the present invention.

FIG. 14 is a partial sectional view illustrating a configuration of Variation 6 of the silicon carbide semiconductor device according to Embodiment 1 of the present invention.

FIG. 15 is a partial sectional view illustrating a configuration of Variation 7 of the silicon carbide semiconductor device according to Embodiment 1 of the present invention.

FIG. 19 is a partial sectional view illustrating a configuration of a silicon carbide semiconductor device according to Embodiment 3 of the present invention.

FIG. 22 is a partial sectional view illustrating a configuration of Variation 2 of the silicon carbide semiconductor device according to Embodiment 4 of the present invention.

FIG. 23 is a partial sectional view illustrating a configuration of Variation 3 of the silicon carbide semiconductor device according to Embodiment 4 of the present invention.

DESCRIPTION OF EMBODIMENTS

Embodiment 1

Device Configuration

Figure 1:
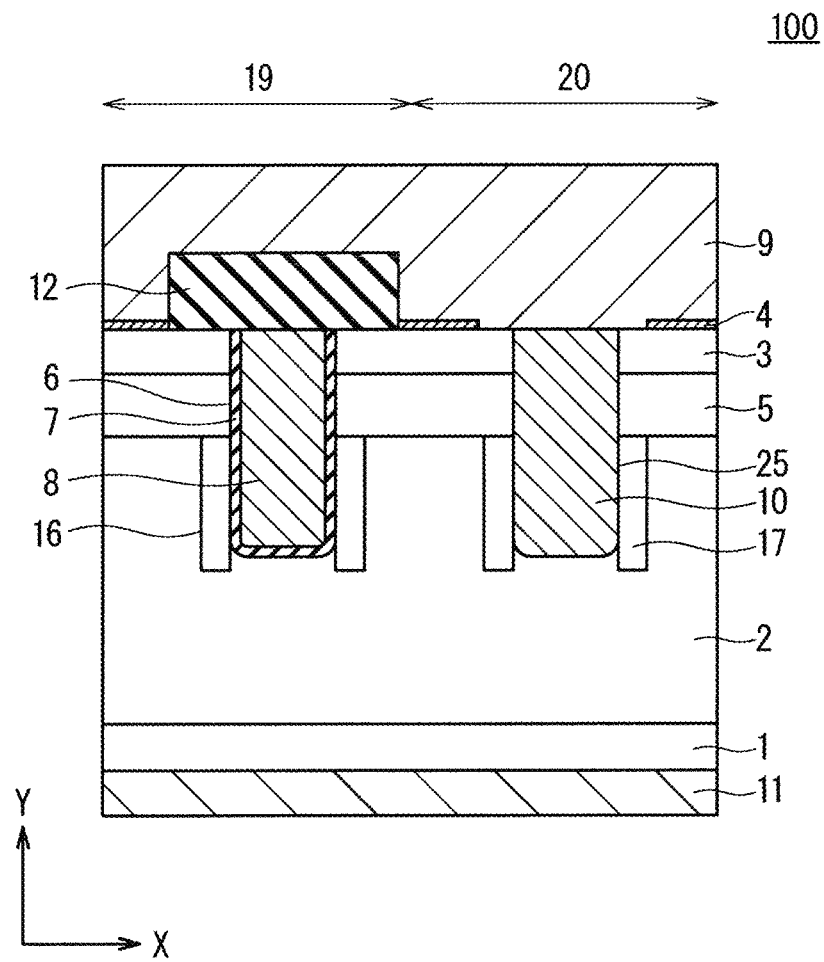
FIG. 1 is a partial sectional view illustrating a configuration of a silicon carbide semiconductor device according to Embodiment 1 of the present invention.

FIG. 1 is a partial sectional view illustrating a configuration of a silicon carbide semiconductor device 100 according to Embodiment 1 of the present invention. In the following description, the term "impurity concentration" indicates a maximum value of the impurity concentration in each impurity region. Since the drawings are illustrated in schematic form, the relative sizes and positions of images illustrated in different drawings are not always accurate and can be appropriately changed. In the following description, identical constituent elements are given the same reference signs and assumed to have the same name and function. Thus, a detailed description thereof may be omitted in some cases.

In the following description, terms that may be used to mean specific positions and directions, such as "upper," "lower," "side," "bottom," "front," and "back," are merely used for convenience's sake in order to facilitate understanding of the content of embodiments, and do not relate to actual positions and directions during implementation.

In the following description, the conductivity type of impurities is generally defined such that an n-type is a first conductivity type, and a p-type is a second conductivity type, but this definition may be reversed.

As illustrated in FIG. 1, the silicon carbide semiconductor device 100 includes a drift layer 2 (semiconductor layer) of a first conductivity type provided on one main surface (first main surface) of a silicon carbide semiconductor substrate (SiC substrate) 1 of the first conductivity type, a body region 5 (second semiconductor region) of a second conductivity type provided on the drift layer 2, and a source region 3 (first semiconductor region) of the first conductivity type provided on the body region 5.

There is also a gate trench 6 (first trench) that extends from the outermost surface of the source region 3 through the source region 3 and the body region 5 to inside the drift layer 2 in a thickness direction. The drift layer 2 is a semiconductor layer formed by epitaxial growth of the SiC substrate 1 and having a lower impurity concentration of the first conductivity type than the SiC substrate 1.

On the inner surface (bottom and side faces) of the gate trench 6, a gate insulating film 7 is provided, and a gate electrode 8 is embedded in the gate trench 6 surrounded by the gate insulating film 7. Then, a low-resistance layer 16 (first low-resistance layer) of the first conductivity type is provided in contact with the side face of the gate trench 6. One end of the low-resistance layer 16 in a depth direction (Y direction) is in contact with the lower face of the body region 5, and the other end thereof is located at a depth of the same order as or slightly deeper than the bottom face of the gate trench 6.

An interlayer insulation film 12 is provided so as to cover the gate trench 6 and the vicinity thereof, and a source contact electrode 4 is provided on the source region 3 that is outside the interlayer insulation film 12. Also, a source electrode 9 (first main electrode) is connected to the source contact electrode 4. The source contact electrode 4 is composed of silicide of a metal such as nickel (Ni) or titanium (Ti) and silicon of the source region 3 and has an ohmic contact with the source region 3.

Moreover, a drain electrode 11 (second main electrode) is provided on the other main surface (second main surface) of the SiC substrate 1 on the side opposite to the source electrode 9.

The trench-gate MOSFET is configured as described above, and a region in which the trench-gate MOSFET (field-effect transistor) is formed is referred to as an MOSFET region 19.

Although not shown in FIG. 1, in a given section, a well contact region having a higher impurity concentration of the second conductivity type than the body region 5 may be formed in contact with each of the body region 5 and the source region 3 in order to establish an ohmic contact with the body region 5.

An SBD region 20 is formed adjacent to the MOSFET region 19. In the SBD region 20, an SBD trench 25 (second trench) that extends from the outermost surface of the source region 3 through the source region 3 and the body region 5 to inside the drift layer 2 in the thickness direction is provided, and instead of the gate insulating film 7 and the gate electrode 8, a Schottky electrode 10 (Schottky barrier diode electrode) is embedded in the SBD trench 25.

The source electrode 9 is in contact with the SBD trench 25 and the source region 3 that is in the vicinity of the SBD trench 25. Then, a low-resistance layer 17 (second low-resistance layer) of the first conductivity type is provided in contact with the side face of the SBD trench 25. Note that the low-resistance layer 17 has a lower impurity concentration of the first conductivity type than the low-resistance layer 16. The low-resistance layer 17 is provided such that its one end in the depth direction (Y direction) is in contact with the lower face of the body region 5 and its other end is located at a depth of the same order as or slightly deeper than the depth of the bottom face of the SBD trench 25.

In plan view, a plurality of gate trenches 6 and a plurality of SBD trenches 25 are alternately arranged, for example in strips, on the SiC substrate 1. Note that the gate electrodes 8 embedded in the gate trenches 6 are connected to gate lines not shown.

Next, the impurity concentrations of each semiconductor layer and each impurity region will be described. The impurity concentration of the first conductivity type in the drift layer 2 is higher than or equal to $1.0\times10^{14}$ cm$^{-3}$ and lower than or equal to $1.0\times10^{17}$ cm$^{-3}$ and is set based on the withstand voltage or other factors of the silicon carbide semiconductor device. The body region 5 is assumed to have an impurity concentration of the second conductivity type higher than or equal to $1.0\times10^{14}$ cm$^{-3}$ and lower than or equal to $1.0\times10^{18}$ cm$^{-3}$. The source region 3 has an impurity concentration of the first conductivity type higher than or equal to $1.0\times10^{18}$ cm$^{-3}$ and lower than or equal to $1.0\times10^{21}$ cm$^{-3}$. Although not shown in FIG. 1, when a well contact region is provided in order to establish an ohmic connect between the body region 5 and the source electrode 3, the impurity concentration of the second conductivity type in the well contact region is set to be higher than or equal to $1.0\times10^{\sim}$ cm$^{-3}$ and lower than or equal to $1.0\times10^{21}$ cm$^{-3}$. This is in order to reduce contact resistance against the source electrode 9, and the well contact region is set to have a higher impurity concentration than the body region 5.

The impurity concentration of the first conductivity type in the low-resistance layer 16 is higher than that in the drift layer 2 and is set to be, for example, higher than or equal to $1.0\times10^{16}$ cm$^{-1}$ and lower than or equal to $1.0\times10^{19}$ cm$^{-3}$. On the other hand, the impurity concentration of the first conductivity type in the low-resistance layer 17 is set to be higher than that in the drift layer 2 and lower than that in the low-resistance layer 16 and is set in the range, for example, higher than $1.0 \times 10^{16}$ cm$^{-3}$ and lower than $1.0 \times 10^{19}$ cm$^{-3}$. More practically, the difference in impurity concentration between the low-resistance layer 16 and the low-resistance layer 17 is set to fall within an order of magnitude. For example, when the drift layer 2 has an impurity concentration of the first conductivity type higher than or equal to $1.0 \times 10^{15}$ cm$^{-3}$ and lower than or equal to $1.0 \times 10^{16}$ cm$^{-3}$, the impurity concentration of the low-resistance layer 17 may be set to be higher than or equal to $2.0 \times 10^{16}$ cm$^{-3}$ and lower than or equal to $1.0 \times 10^{17}$ cm$^{-3}$, and the impurity concentration of the low-resistance layer 16 may be set to be higher than or equal to $4.0 \times 10^{16}$ cm$^{-3}$ and lower than or equal to $1.0 \times 10^{18}$ cm$^{-3}$.

Operations

Next, operations of the silicon carbide semiconductor device 100 will be described briefly. Referring to FIG. 1, when a voltage greater than or equal to a threshold voltage is applied to the gate electrode 8 in the MOSFET region 19, the conductivity type of the body region 5 is reversed, i.e., a channel of the first conductivity type is formed along the side face of the gate trench 6. Then, a current path of the same conductivity type is formed in the range between the source electrode 9 and the drain electrode 11, and accordingly current flows between the source electrode 9 and the drain electrode 11. In this way, the silicon carbide semiconductor device 100 is turned on by the application of a voltage greater than or equal to the threshold voltage to the gate electrode 8.

When a voltage less than the threshold voltage is applied to the gate electrode 8, no channel is formed in the body region 5, and therefore such a current path as described in the case of ON state is not formed. Thus, even if a voltage is applied between the drain electrode 11 and the source electrode 9, almost no current flows from the drain electrode 11 to the source electrode 9. When the voltage at the gate electrode 8 is less than the threshold voltage as described above, the silicon carbide semiconductor device 100 is in the OFF state. In this way, the silicon carbide semiconductor device 100 operates by switching between the ON and OFF states by control of the voltage applied to the gate electrode 8.

Meanwhile, when a forward voltage is applied to the Schottky barrier diode in the SBD region 20 in the OFF state of the silicon carbide semiconductor device 100, unipolar current starts to flow between the Schottky electrode 10 and the drain electrode 11. At this time, the unipolar current increases for a while with an increase in the forward voltage, but when a difference in potential between the source electrode 9 and the drain electrode 11 has reached a given value, bipolar current resulting from a pn junction between the body region 5 and the drift layer 2 starts to flow between the body region 5 and the drain electrode 11. The unipolar current that can flow immediately before the bipolar current starts to flow is referred to as maximum unipolar current. The magnitude of the maximum unipolar current is affected by the pn junction between the body region 5 and the drift layer 2 and the potential difference occurring in the drift layer 2.

For example, when the low-resistance layer 17 is set to have a low impurity concentration of the first conductivity type, the resistance between the SBD trench 25 and the gate trench 6 increases and consequently bipolar current flows without a large flow of unipolar current. As a result, the effect of suppressing bipolar current may not be obtained enough even in the case where the MOSFET includes SBDs. In view of this, if the low-resistance layer 17 is set to have a high impurity concentration of the first conductivity type, leakage current may increase as a result of the electric field in the low-resistance layer 17 in the vicinity of the SBD trench 25 being increased by the application of a high drain voltage in the OFF state.

The same applies to the MOSFET region 19, and when the low-resistance layer 16 is set to have a low impurity concentration, the ON-state resistance of the MOSFET will increase. Conversely, when the low-resistance layer 16 is set to have a high impurity concentration, the reliability of the gate insulating film 7 may be lowered as a result of an increase in the electric field applied to the corners of the bottom of the gate trench 6.

In the case of the MOSFET region 19, a local increase in the electric field at the corners of the bottom of the gate trench 6 can be moderated to some extent by increasing the thickness of the gate insulating film 7. However, the same technique cannot be used for the SBD region 20 due to the absence of an oxide film. That is, it can be said that suppressing leakage current in the SBD region 20 in the OFF state is more difficult than in the MOSFET region 19.

In contrast, in Embodiment 1 according to the present invention, the impurity concentration of the first conductivity type in the low-resistance layer 17 formed adjacent to the SBD trench 25 is set to be independent of and smaller than that in the low-resistance layer 16 formed adjacent to the gate trench 6. This enables reducing leakage current in the SBD region 20 while reducing the ON-state resistance of the MOSFET region 19. Moreover, although the electric field that is applied to the gate insulating film 7 of the MOSFET can be controlled by changing the thickness of the gate insulating film 7 as described previously, the electric field that is applied to the vicinity of the SBD is determined mainly by the impurity concentration in the vicinity of the SBD region 20. Accordingly, the electric field that is applied to the vicinity of the SBD can be adjusted by setting the impurity concentration of the first conductivity type in the low-resistance layer 17 and the impurity concentration of the first conductivity type in the drift layer 2 to the aforementioned values.

Manufacturing Method

A method of manufacturing the silicon carbide semiconductor device 100 will be described hereinafter with reference to FIGS. 2 to 8, which are sectional views illustrating manufacturing steps in orderly sequence.

Figure 2:
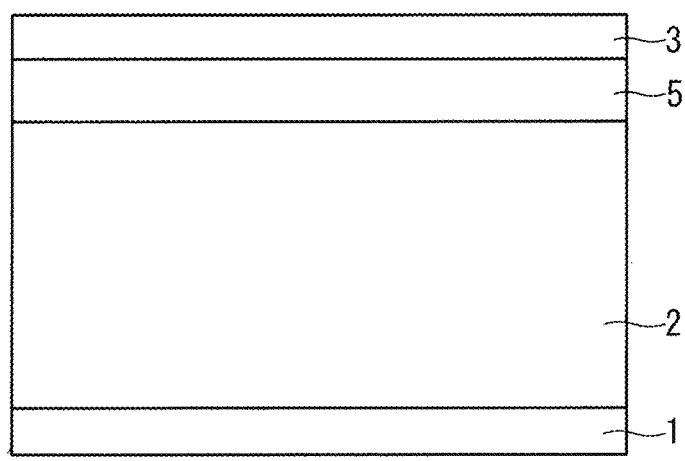
FIG. 2 is a partial sectional view illustrating a method of manufacturing the silicon carbide semiconductor device according to Embodiment 1 of the present invention.

First, in the step illustrated in FIG. 2, the drift layer 2 of the first conductivity type composed of silicon carbide is formed on the SiC substrate 1 of the first conductivity type. More specifically, the drift layer 2 is formed by epitaxial growth on the SiC substrate 1. In this case, the drift layer 2 is formed so as to have an impurity concentration of the first conductivity type higher than or equal to $1.0 \times 10^{14}$ cm$^{-3}$ and lower than or equal to $1.0 \times 10^{17}$ cm$^{-3}$, which corresponds to the above-described impurity concentration of the first conductivity type in the drift layer 2.

Then, the source region 3 and the body region 5 are each formed by ion implantation in the upper layer portion of the drift layer 2 as illustrated in FIG. 2. In the case of forming a region of the first conductivity type, the ion implantation is implemented by implanting ions serving as donors such as nitrogen (N) or phosphorus (P), and in the case of forming a region of the second conductivity type, the ion implantation is implemented by implanting ions serving as acceptors such as aluminum (Al) or boron (B). Note that the source region 3 has an impurity concentration of the first conductivity type higher than or equal to $1.0 \times 10^{18}$ cm$^{-3}$ and lower than or equal to $1.0 \times 10^{21}$ cm$^{-3}$, and the body region 5 has an impurity concentration of the second conductivity type higher than or equal to $1.0 \times 10^{14}$ cm$^{-3}$ and lower than or equal to $1.0 \times 10^{18}$ cm$^{-3}$.

The order in which each region is formed may be inverted, and all or some of the regions may be formed by epitaxial growth, instead of ion implantation. Although not shown, a well contact region having a higher impurity concentration of the second conductivity type than the body region 5 may be formed in the vicinity of the surface of the body region 5 by techniques such as selective ion implantation using a mask.

Figure 3:
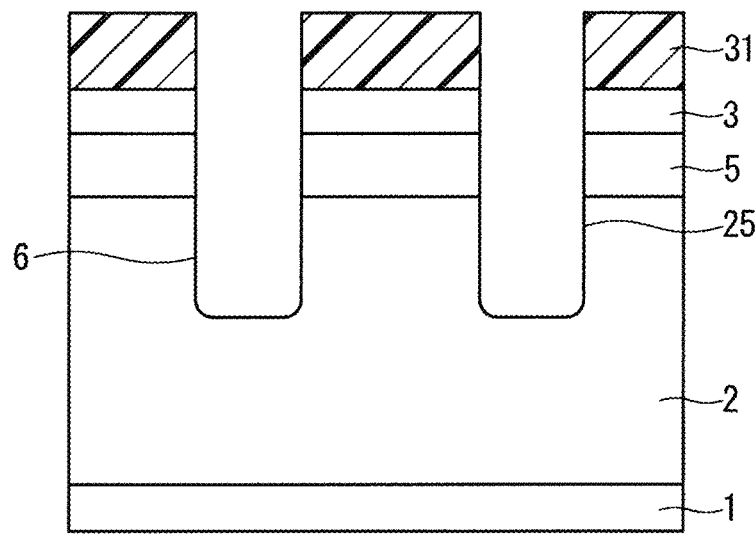
FIG. 3 is a partial sectional view illustrating the method of manufacturing the silicon carbide semiconductor device according to Embodiment 1 of the present invention.

Next, in the step illustrated in FIG. 3, the gate trench 6 and the SBD trench 25 that extend from the surface of the source region 3 through the body region 5 to inside the drift layer 2 are formed by reactive ion etching (RIE) is performed using a mask 31 provided on the source region 3.

Figure 4:
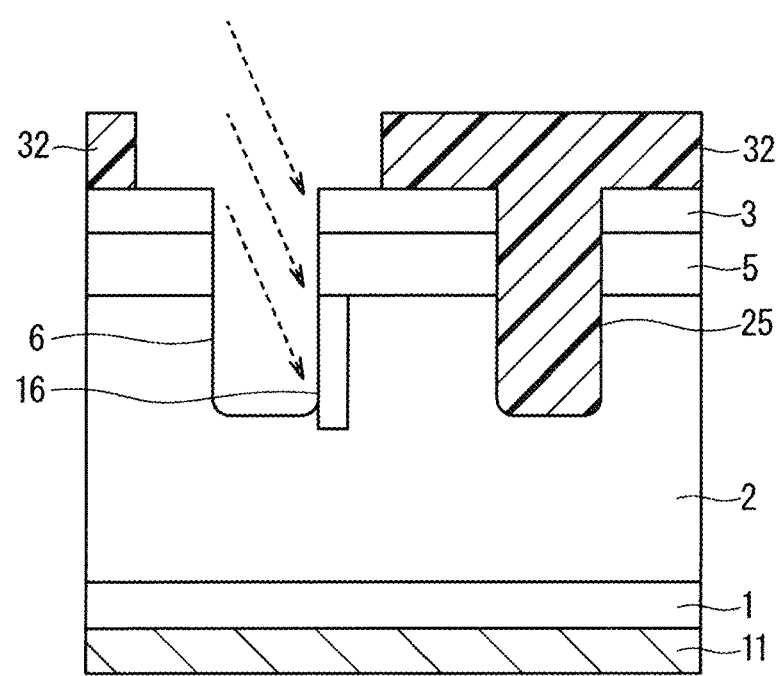
FIG. 4 is a partial sectional view illustrating the method of manufacturing the silicon carbide semiconductor device according to Embodiment 1 of the present invention.

Next, in the step illustrated in FIG. 4, selective ion implantation is conducted using a mask 32 provided on the source region 3. That is, the low-resistance layer 16 of the first conductivity type is formed on the right side of the gate trench 6 by first forming the mask 32 that exposes the gate trench 6 and the vicinity thereof on the source region 3 and then implanting ions in a slanting direction that forms a constant inclination angle with the inner wall of the gate trench 6.

In the case illustrated in FIG. 4, ions are implanted from the upper left to the lower right in the drawing to form the low-resistance layer 16 on the right side of the gate trench 6. Contrary to the case in FIG. 4, it is also possible to form the low-resistance layer 16 on the left side of the gate trench 6 by implanting ions from the upper right to the lower left in the drawing. In this way, the low-resistance layer 16 can be formed on both right and left sides of the gate trench 6, but a configuration in which the low-resistance layer 16 is formed only on one side and is not formed on the other side may also be selectable.

Figure 5:
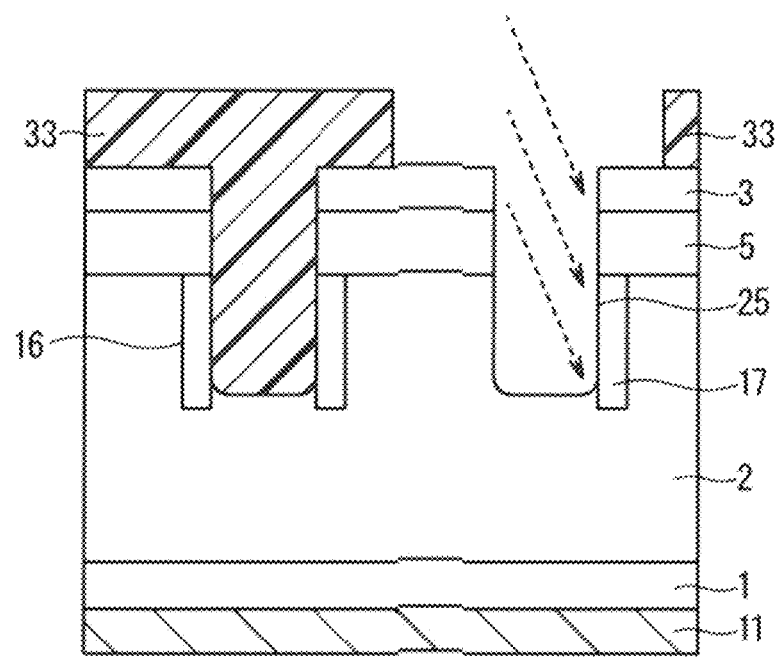
FIG. 5 is a partial sectional view illustrating the method of manufacturing the silicon carbide semiconductor device according to Embodiment 1 of the present invention.

Then, after the mask 32 is removed, in the step illustrated in FIG. 5, the low-resistance layer 17 of the first conductivity type is formed on the right side of the SBD trench 25 by first forming a mask 33 that exposes the SBD trench 25 and the vicinity thereof on the source region 3 and then implanting ions in a slanting direction that forms a constant inclination angle with the inner wall of the SBD trench 25.

In the case illustrated in FIG. 5, ions are implanted from the upper left to the lower right in the drawing to form the low-resistance layer 17 on the right side of the SBD trench 25. Contrary to the case in FIG. 5, it is also possible to form the low-resistance layer 17 on the left side of the SBD trench 25 by implanting ions from the upper right to the lower left in the drawing. In this ion implantation, the dose of implantation is determined such that the low-resistance layer 17 has a lower impurity concentration of the first conductivity type than the low-resistance layer 16. In this way, the low-resistance layer 17 can be formed on both right and left sides of the SBD trench 25, but a configuration in which the low-resistance layer 17 is formed only on one side and is not formed on the other side may also be selectable.

Thereafter, heat treatment is conducted in order to electrically activate impurities implanted in the drift layer 2. This heat treatment is desirably conducted in an inert gas atmosphere such as an argon (Ar) or nitrogen (N) atmosphere or in vacuum at a temperature higher than or equal to 1500° C. and lower than or equal to 2200° C. for a period of time longer than or equal to 0.5 minutes and shorter than or equal to 60 minutes. Alternatively, this heat treatment may be conducted while the surface of the drift layer 2 is covered with a film composed of carbon. This covering prevents the surface of the drift layer 2 from becoming rough due to etching caused by reactions of residual moisture and residual oxygen in heat treatment equipment during the heat treatment.

Figure 6:
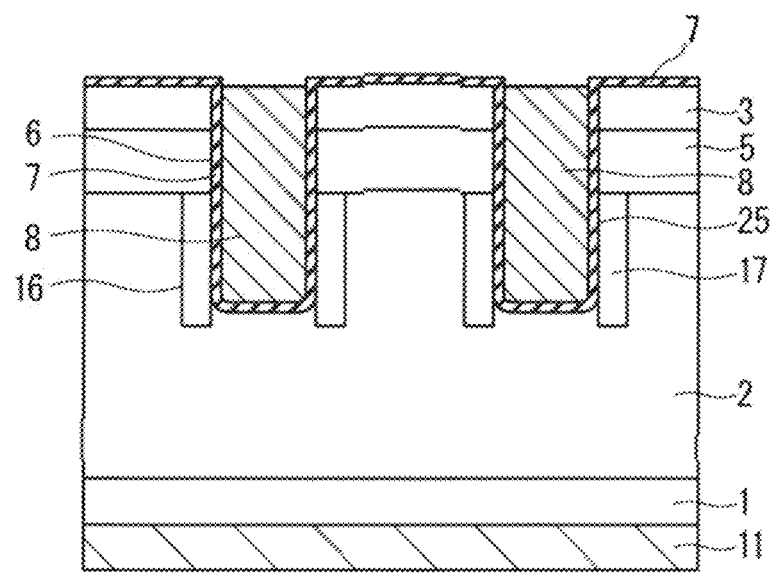
FIG. 6 is a partial sectional view illustrating the method of manufacturing the silicon carbide semiconductor device according to Embodiment 1 of the present invention.

Next, in the step illustrated in FIG. 6, the gate insulating film 7 is formed of, for example, a silicon oxide film so as to cover the source region 3 and the inner faces of the gate trench 6 and the SBD trench 25, and the gate electrode 8 is embedded in the gate trench 6 and the SBD trench 25 that are covered with the gate insulating film 7. The gate electrode 8 may be formed by, for example, forming a conductor of polysilicon or other materials on the entire surface of the source region 3 and selectively removing the conductor on the source region 3 so as to leave the conductor inside the gate trench 6 and the SBD trench 25.

Figure 7:
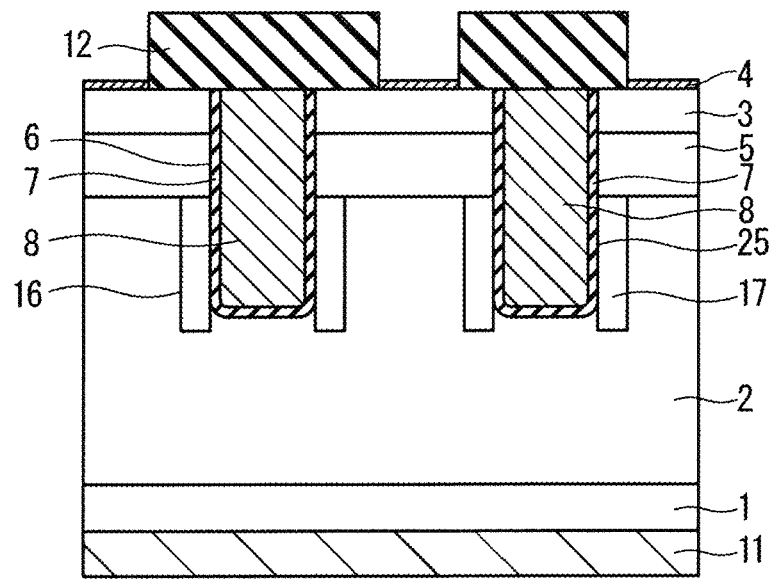
FIG. 7 is a partial sectional view illustrating the method of manufacturing the silicon carbide semiconductor device according to Embodiment 1 of the present invention.

Next, in the step illustrated in FIG. 7, the interlayer insulation film 12 is formed of, for example, a silicon oxide film on the entire surfaces of the gate electrode 8 and the source region 3 and is then exposed in part by techniques such as selective etching using a resist mask or the like to form a source contact portion. At this time, the gate insulating film 7 is also removed from above portions that are not covered with the resist mask or the like. Since the gate insulating film 7 is a film having the same properties as the material for the interlayer insulation film 12, portions of the gate insulating film 7 that are covered with the resist mask or the like are integrated with the interlayer insulation film 12.

Thereafter, the source contact electrode 4 is formed in contact with the source region 3 and the well contact region (not shown) that are exposed at the bottom of the opening. A method of forming the source contact electrode 4 involves depositing a metal film composed primarily of Ni on the entire surface of the source region 3 including the inside of the opening that becomes a source contact portion, forming a silicide film that becomes the source contact electrode 4 by causing reactions of the metal film and silicon carbide through heat treatment conducted at a temperature higher than or equal to 600° C. and lower than or equal to 1100° C., and thereafter removing an unreacted portion of the metal film that remains on the interlayer insulation film 12 by wet etching using nitric acid, sulfuric acid, or hydrochloric acid or using a liquid mixture of any of these acids and a hydrogen peroxide solution. Note that another heat treatment may be conducted after the removal of the metal film remaining on the interlayer insulation film 12. In this case, the latter heat treatment is conducted at a higher temperature than the temperature of the former heat treatment in order to establish an ohmic contact with lower contact resistance.

Figure 8:
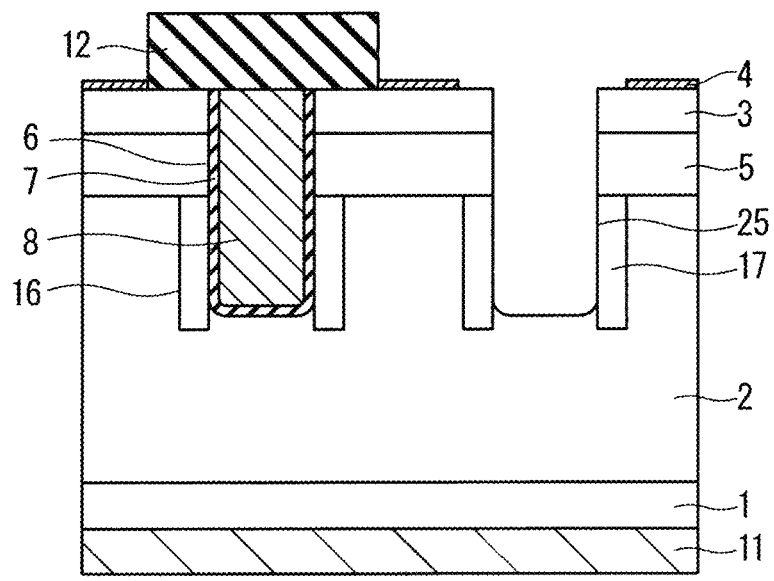
FIG. 8 is a partial sectional view illustrating the method of manufacturing the silicon carbide semiconductor device according to Embodiment 1 of the present invention.
Figure 1:
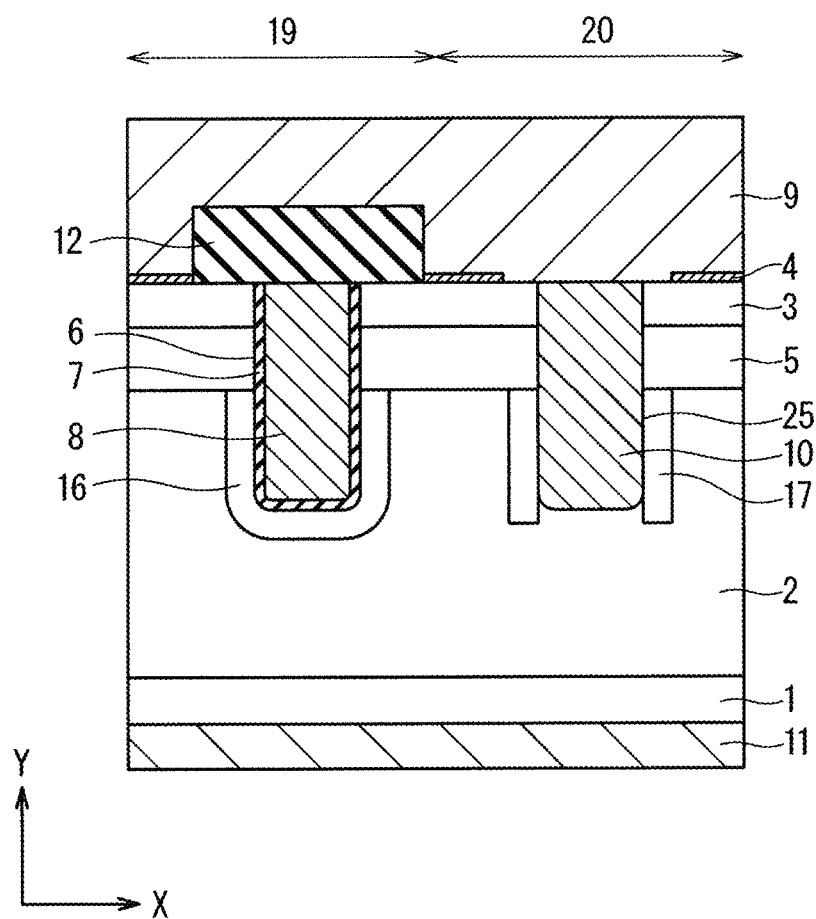

Next, in the step illustrated in FIG. 8, the interlayer insulation film 12 on the SBD trench 25 is removed and then the gate electrode 8 and the gate insulating film 7 in the SBD trench 25 are removed by techniques such as selective etching using a resist mask or the like. At this time, the interlayer insulation film 12 and the gate insulating film 7 may be removed by wet etching using an acid solution, and the gate electrode 8 may be removed by wet etching using an alkaline solution.

Thereafter, the Schottky electrode 10 is formed by embedding components such as Ti, molybdenum (Mo), and Ni in the SBD trench 25 by sputtering or other techniques. Then, the source electrode 9 is formed in contact with the Schottky electrode 10, the surface of the source region 3, and the surface of the source contact electrode 4, and the drain electrode 11 is formed on the rear surface of the SiC substrate 1. This forms the silicon carbide semiconductor device 100 illustrated in FIG. 1.

Alternatively, the steps after the step described with reference to FIG. 5 may be such that the SBD trench 25 is covered with a mask, the gate insulating film 7 is formed on the inner face of the gate trench 6, and the gate electrode 8 is embedded in the gate trench 6. Then, the gate trench 6 may be covered with a mask, and the Schottky electrode 10 may be embedded in the SBD trench 25.

Advantageous Effects

The silicon carbide semiconductor device 100 according to Embodiment 1 of the present invention achieves advantageous effects as follows. In FIG. 1, the resistance around the gate trench 6 is reduced by the presence of the low-resistance layer 16 with a high concentration, which is in contact with the gate trench 6, but an electric field in the vicinity of the Schottky interface is reduced because the low-resistance layer 17 in contact with the SBD trench 25 has a lower impurity concentration than the low-resistance layer 16. As a result, leakage current derived from the Schottky interface decreases, and high reliability is achieved. Moreover, the unipolar current flowing with the application of forward voltage to built-in SBDs increases due to the presence of the low-resistance layer 16 with a high concentration around the gate trench 6 and the presence of the low-resistance layer 17 with a low concentration around the SBD trench 25. This makes it hard to turn on parasitic body diodes and produces a fine effect of suppressing a flow of bipolar current. Moreover, the trench-type Schottky electrode 10 eliminates the need to increase the dimension of an SBD in the planar direction (X direction) in FIG. 1 when increasing the area of the SBD. As a result, it is possible to reduce the chip area necessary for the same amount of flow of the unipolar current and to reduce the chip cost.

In the example shown in FIG. 1, the low-resistance layer 16 and the low-resistance layer 17 are formed to positions deeper than the positions of the bottoms of the gate trench 6 and the SBD trench 25. In this case, the effect of reducing the ON-state resistance of the MOSFET and the effect of improving the flow of unipolar current in SBDs will increase.

Variation 1

FIG. 9 is a partial sectional view illustrating a configuration of a silicon carbide semiconductor device 100A according to Variation 1 of Embodiment 1. As illustrated in FIG. 9, in the silicon carbide semiconductor device 100A, the low-resistance layer 16 and the low-resistance layer 17 are formed to positions shallower than the positions of the bottoms of the gate trench 6 and the SBD trench 25.

With this configuration, if the low-resistance layer 16 and the low-resistance layer 17 are made to have the same impurity concentrations as those in the silicon carbide semiconductor device 100, the effect of reducing the ON-state resistance of the MOSFET and the effect of improving the flow of unipolar current in SBDs will diminish as compared with those achieved by the silicon carbide semiconductor device 100, but instead it is possible to moderate electric fields applied to the bottoms and corners of the gate trench 6 and the SBD trench 25. As a result, the effect of improving the reliability of the oxide film and the effect of reducing leakage current in SBDs are achieved.

Variation 2

FIG. 10 is a partial sectional view illustrating a configuration of a silicon carbide semiconductor device 100B according to Variation 2 of Embodiment 1. As illustrated in FIG. 10, in the silicon carbide semiconductor device 100B, the low-resistance layer 16 is formed to a position deeper than the bottom of the gate trench 6, and the low-resistance layer 17 is formed only to a position shallower than the bottom of the SBD trench 25. With this configuration, it is possible to achieve the effect of reducing the ON-state resistance of the MOSFET and the effect of reducing leakage current in SBDs.

Conversely, the low-resistance layer 16 may be formed only to a position shallower than the bottom of the gate trench 6, and the low-resistance layer 17 may be formed to a position deeper than the bottom of the SBD trench 25. With this configuration, it is possible to achieve the effect of improving the reliability of the oxide film and the effect of improving the flow of unipolar current in SBDs.

Variation 3

FIG. 11 is a partial sectional view illustrating a configuration of a silicon carbide semiconductor device 100C according to Variation 3 of Embodiment 1. As illustrated in FIG. 11, in the silicon carbide semiconductor device 100C, the low-resistance layer 16 is formed in contact with not only the side face of the gate trench 6 but also the bottom of the gate trench 6. When the low-resistance layer 16 is formed by ion implantation, impurities are implanted to some extent to the bottom of the gate trench 6 depending on the angle of inclination in the ion implantation.

This configuration facilitates current diffusion in the planar direction (X direction) and achieves the effect of reducing the ON-state resistance because the current flowing through the MOSFET region 19 flows to the low-resistance layer 16 that is in contact with the bottom of the gate trench 6.

Although the example of forming the low-resistance layer 16 that is also in contact with the bottom of the gate trench 6 is shown in FIG. 11, instead the low-resistance layer 17 may be formed in contact with the bottom of the SBD trench 25.

This configuration facilitates current diffusion in the planar direction (X direction) and improves the effect of suppressing bipolar current because the unipolar current flowing through the SBD region 20 flows to the low-resistance layer 17 that is in contact with the bottom of the SBD trench 25.

Alternatively, a configuration is also possible in which the low-resistance layer 16 is formed also in contact with the bottom of the gate trench 6 and the low-resistance layer 17 is formed also in contact with the bottom of the SBD trench 25. With this configuration, it is possible to reduce the ON-state resistance in the MOSFET region 19 and to improve the effect of suppressing bipolar current in the SBD region 20.

Variation 4

Figure 12:
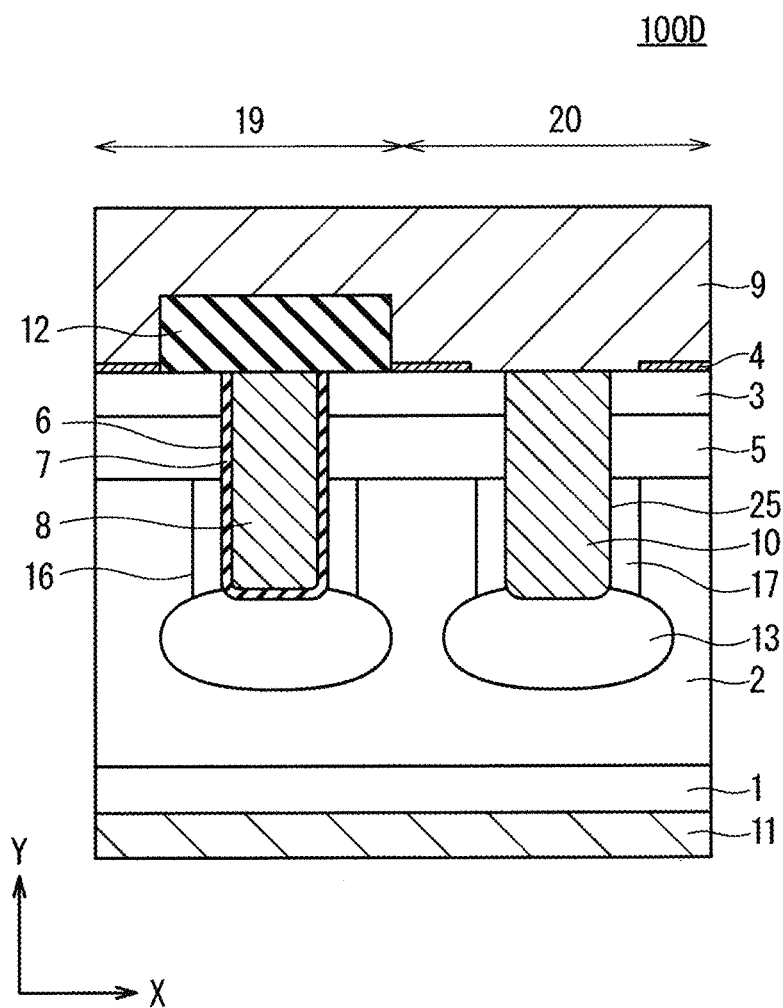
FIG. 12 is a partial sectional view illustrating a configuration of Variation 4 of the silicon carbide semiconductor device according to Embodiment 1 of the present invention.

FIG. 12 is a partial sectional view illustrating a configuration of a silicon carbide semiconductor device 100D according to Variation 4 of Embodiment 1. As illustrated in FIG. 12, in the silicon carbide semiconductor device 100D, a protective layer 13 of the second conductivity type may be formed in contact with the bottoms of the gate trench 6 and the SBD trench 25.

With this configuration, it is possible to achieve the effect of moderating electric fields applied to the vicinity of the bottoms of the gate trench 6 and the SBD trench 25. Alternatively, the protective layer 13 may be formed on only either of the gate trench 6 and the SBD trench 25.

The protective layer 13 may be formed by ion implantation and may have an impurity concentration of the second conductivity type higher than or equal to $1\times10^{14}$ and lower than or equal to $1\times10^{20}$ cm$^{-3}$.

Variation 5

Figure 13:
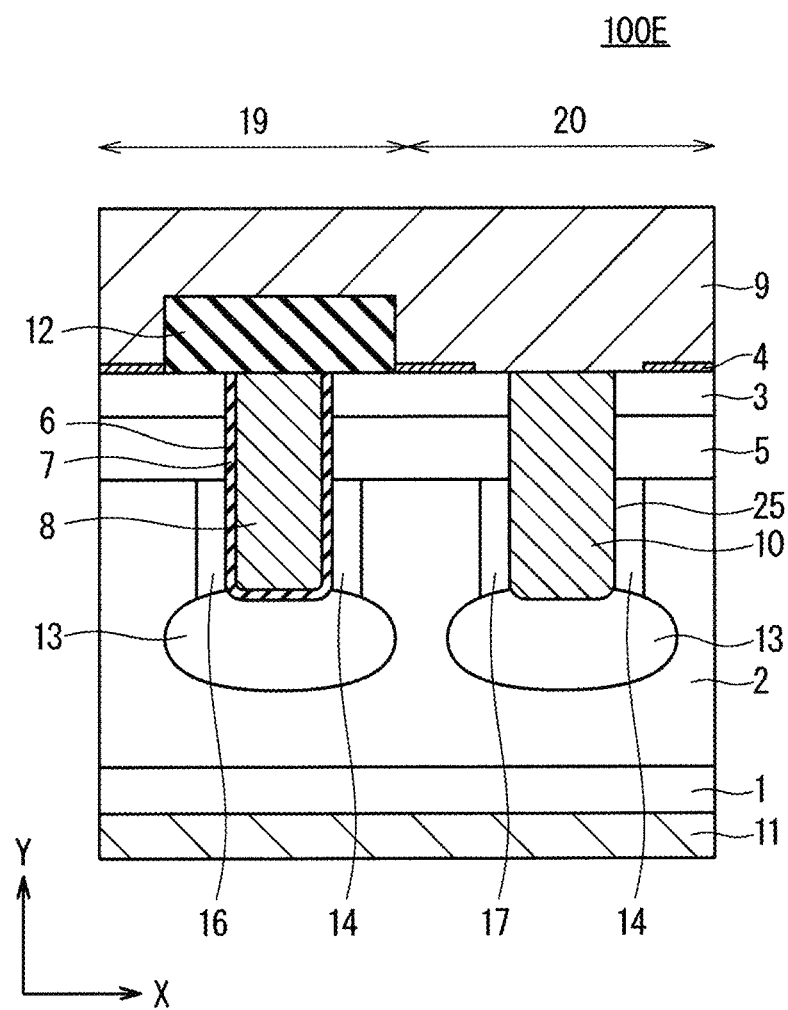
FIG. 13 is a partial sectional view illustrating a configuration of Variation 5 of the silicon carbide semiconductor device according to Embodiment 1 of the present invention.

FIG. 13 is a partial sectional view illustrating a configuration of a silicon carbide semiconductor device 100E according to Variation 5 of Embodiment 1. As illustrated in FIG. 13, in the silicon carbide semiconductor device 100E, a connection layer 14 for electrically connecting the body region 5 and the protective layer 13 may be formed, instead of the low-resistance layer 16, on one side face of the gate trench 6, and a connection layer 14 of the second conductivity type for electrically connecting the body region 5 and the protective layer 13 may be formed, instead of the low-resistance layer 17, on one side face of the SBD trench 25.

The connection layers 14 may be formed by ion implantation and may have an impurity concentration of the second conductivity type higher than or equal to $1\times10^{14}$ and lower than or equal to $1\times10^{20}$ cm$^{-3}$.

Alternatively, part of the low-resistance layer 16 and part of the low-resistance layer 17 may be replaced by the connection layers 14, instead of replacing the low-resistance layer 16 and the low-resistance layer 17 in their entirety.

This configuration allows the protective layer 13 to be electrically connected to the body region 5 via the connection layers 14 and thus enables discharging the protective layer 13 or recharging the protective layer 13 via the source region 3 or the well contact region (not shown) at turn-on or turn-off. Accordingly, the path length of charge carriers is shortened, and an increase in potential is suppressed. As a result, the reliability of the gate insulating film 7 is improved.

Variation 6

FIG. 14 is a partial sectional view illustrating a configuration of a silicon carbide semiconductor device 100F according to Variation 6 of Embodiment 1. Although the silicon carbide semiconductor device 100E illustrated in FIG. 13 has a configuration in which the protective layer 13 is in contact with the bottoms of the gate trench 6 and the SBD trench 25 in their entirety, the protective layer 13 in the silicon carbide semiconductor device 100F illustrated in FIG. 14 is formed in contact with the bottoms on the sides on which the connection layers 14 are formed, and the protective layer 13 is not in contact with the bottoms on the sides on which the low-resistance layer 16 and the low-resistance layer 17 are formed. This configuration reduces the area of the impurity regions of the second conductivity type at the bottoms of the gate trench 6 and the SBD trench 25 and increases the area of the impurity regions of the first conductivity type. Accordingly, it is possible to facilitate unipolar current diffusion in the planar direction (X direction) of the MOSFET and SBDs and to improve the effect of reducing the ON-state resistance and the effect of suppressing a flow of bipolar current.

Variation 7

FIG. 15 is a partial sectional view illustrating a configuration of a silicon carbide semiconductor device 100G according to Variation 7 of Embodiment 1. Although the silicon carbide semiconductor device 100E illustrated in FIG. 13 has a configuration in which the connection layers 14 are arranged on the right sides of the gate trench 6 and the SBD trench 25 in section, the connection layers 14 in the silicon carbide semiconductor device 100F illustrated in FIG. 15 may be arranged on the opposing side faces of the gate trench 6 and the SBD trench 25.

With this configuration, each of the connection layers 14 serves as a high-resistance layer in the MOSFET region 19 and the SBD region 20 on the sides on which the connection layers 14 are formed, and accordingly the MOSFET current and the SBD current decrease. However, in the MOSFET region 19 and the SBD region 20 on the sides on which the connection layers 14 are not formed, the MOSFET current and the SBD current do not decrease.

Figure 16:
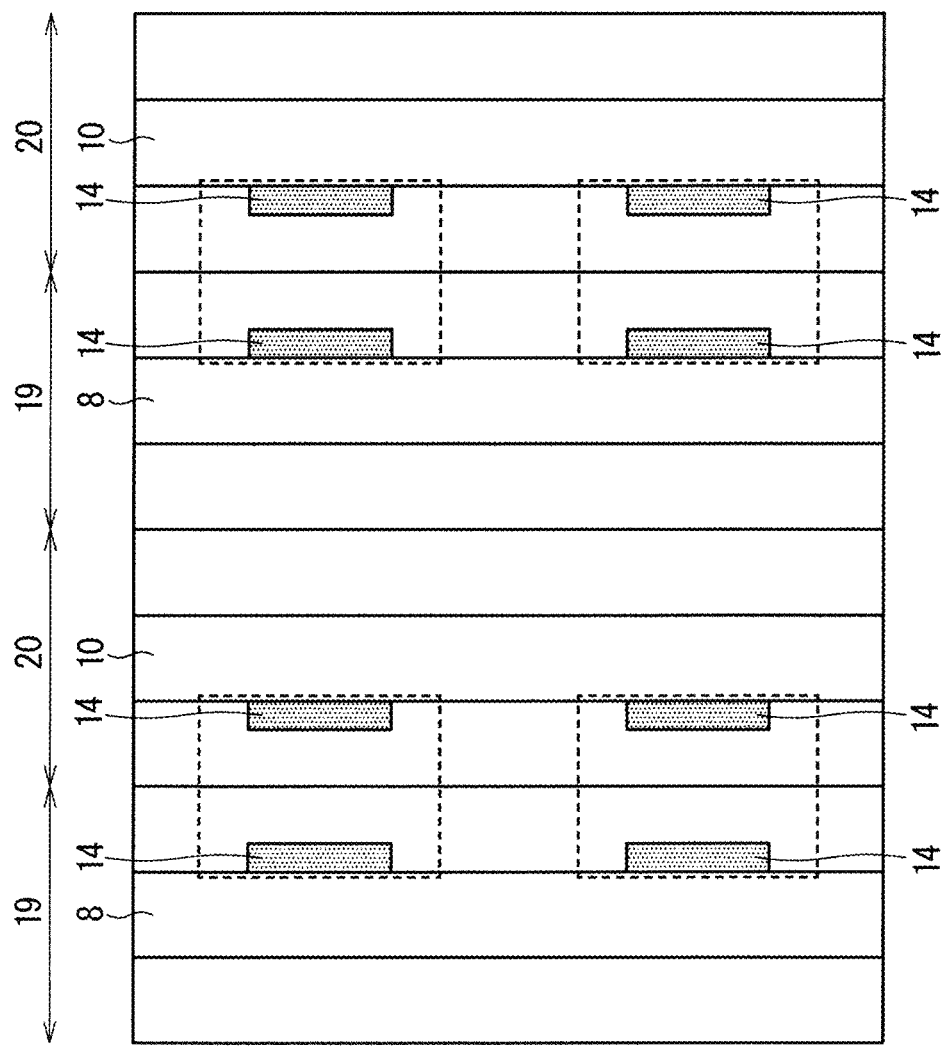
FIG. 16 is a plan view schematically illustrating regions in which MOSFET current and SBD current decrease.

FIG. 16 is a plan view schematically illustrating regions where the MOSFET current and the SBD current decrease, and shows that a plurality of gate trenches 6 in strip form and a plurality of SBD trenches 25 in strip form are alternately arranged.

In FIG. 16, the regions enclosed by broken lines indicate current-reducing regions in which the MOSFET current and the SBD current decrease. Although the MOSFET current and the SBD current decrease in the regions where the connection layers 14 face each other, there is no current-reducing regions in the MOSFET region 19 and the SBD region 20 on the sides on which the connection layers 14 are not formed. Accordingly, it is possible to suppress the area of the current-reducing regions to a minimum, to suppress decreases in MOSFET and SBD currents, and to suppress an increase in ON-state resistance.

Embodiment 2

Figure 17:
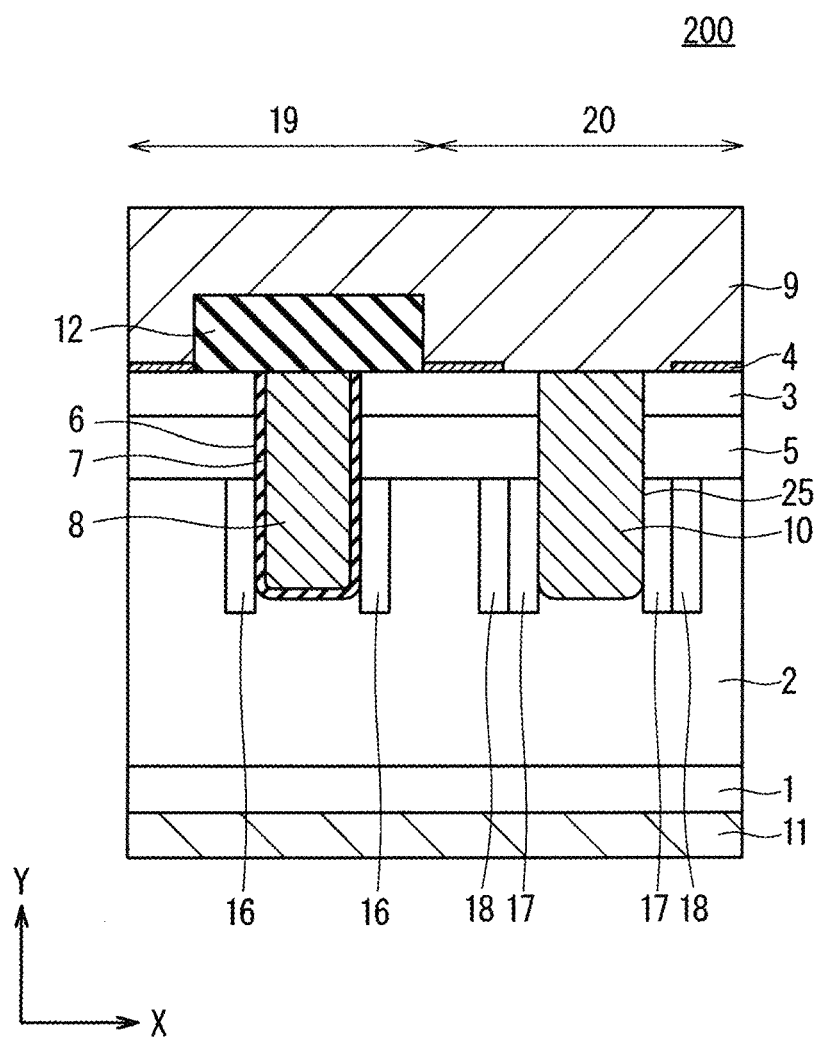
FIG. 17 is a partial sectional view illustrating a configuration of a silicon carbide semiconductor device according to Embodiment 2 of the present invention.

FIG. 17 is a partial sectional view illustrating a configuration of a silicon carbide semiconductor device 200 according to Embodiment 2 of the present invention. In FIG. 17, constituent elements that are the same as those of the silicon carbide semiconductor device 100 described with reference to FIG. 1 are given the same reference signs, and a redundant description thereof shall be omitted.

The silicon carbide semiconductor device 200 illustrated in FIG. 17 differs from the silicon carbide semiconductor device 100 according to Embodiment 1 in that it includes a low-resistance layer 17 formed in contact with the SBD trench 25 and a low-resistance layer 18 (third low-resistance layer) of the first conductivity type provided in contact with the side face of the low-resistance layer 17 outside the low-resistance layer 17. The impurity concentration in the low-resistance layer 18 is set to be higher than the impurity concentration in the low-resistance layer 17 and may be set to be, for example, higher than or equal to $2.0\times10^{16}$ and lower than or equal to $2.0\times10^{19}$ cm$^{-3}$.

When the low-resistance layer 17 and the low-resistance layer 18 are formed by ion implantation, one example of the methods is forming the low-resistance layer 18 by implanting ions in a slanting direction with a high implantation energy and then forming the low-resistance layer 17 by implanting ions in a slanting direction with a lower implantation energy so as to form a retrograde profile. This forms a configuration in which the impurity concentration in the vicinity of the SBD trench 25 is low, and the impurity concentration in a region slightly away from the SBD trench 25 is high.

This configuration facilitates lateral diffusion of unipolar current flowing through SBDs and improves the effect of suppressing a flow of bipolar current. Besides, it is possible to minimum leakage current at turn-off of the MOSFET because the impurity concentration in the vicinity of the SBD trench 25 is low.

Although the example in which the low-resistance layer 18 is provided on the SBD trench 25 is shown in FIG. 17, the low-resistance layer 18 (third low-resistance layer) may be provided in contact with the side face of the low-resistance layer 16 that is in contact with the gate trench 6, outside this low-resistance layer 16 in the same manner. In this case as well, the impurity concentration in the low-resistance layer 18 is set to be higher than the impurity concentration in the low-resistance layer 16 and may be set to be, for example, higher than or equal to $2.0 \times 10^{16}$ and lower than or equal to $2.0 \times 10^{19}$ cm$^{-3}$. With this configuration, it is possible to achieve the effect of moderating the electric field applied to the gate insulating film 7 while increasing the ON-state current flowing through the MOSFET.

Variation 1

Figure 18:
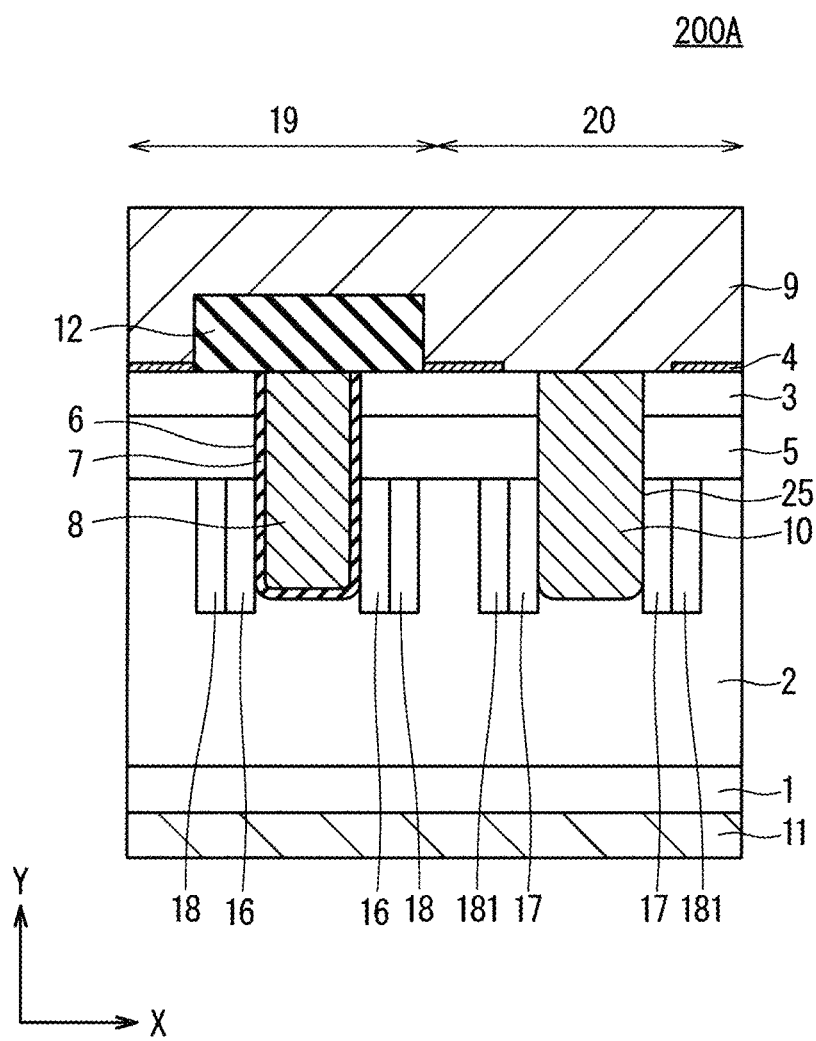
FIG. 18 is a partial sectional view illustrating a configuration of Variation of the silicon carbide semiconductor device according to Embodiment 2 of the present invention.

FIG. 18 is a partial sectional view illustrating a configuration of a silicon carbide semiconductor device 200A according to Variation 1 of Embodiment 2. In the silicon carbide semiconductor device 200A illustrated in FIG. 18, the low-resistance layer 18 is formed in contact with the low-resistance layer 16, and a low-resistance layer 181 (third low-resistance layer) of the first conductivity type is formed in contact with the side face of the low-resistance layer 17. In this case as well, the impurity concentration in the low-resistance layer 18 is set to be higher than the impurity concentration in the low-resistance layer 16, and the impurity concentration in the low-resistance layer 181 is set to be higher than the impurity concentration in the low-resistance layer 17. With this configuration, it is possible to moderate the electric field applied to the gate insulating film 7 while increasing the ON-state current flowing through the MOSFET and to improve the effect of suppressing a flow of bipolar current. Besides, it is also possible to minimize leakage current at turn-off of the MOSFET.

Embodiment 3

FIG. 19 is a partial sectional view illustrating a configuration of a silicon carbide semiconductor device 300 according to Embodiment 3 of the present invention. In FIG. 19, constituent elements that are the same as those of the silicon carbide semiconductor device 100 described with reference to FIG. 1 are given the same reference signs, and a redundant description thereof shall be omitted.

The silicon carbide semiconductor device 300 illustrated in FIG. 19 differs from the silicon carbide semiconductor device 100 according to Embodiment 1 in that the low-resistance layer 16 and the low-resistance layer 17 are formed in contact with each other at the boundary between the MOSFET region 19 and the SBD region 20.

This configuration facilitates lateral diffusion of the MOSFET current and the SBD unipolar current and improves the effect of reducing the ON-state resistance and the effect of suppressing a flow of bipolar current. Note that the low-resistance layer 16 and the low-resistance layer 17 are formed by implanting ions in a slanting direction at a constant inclination angle as in Embodiments 1 and 2.

Embodiment 4

Figure 20:
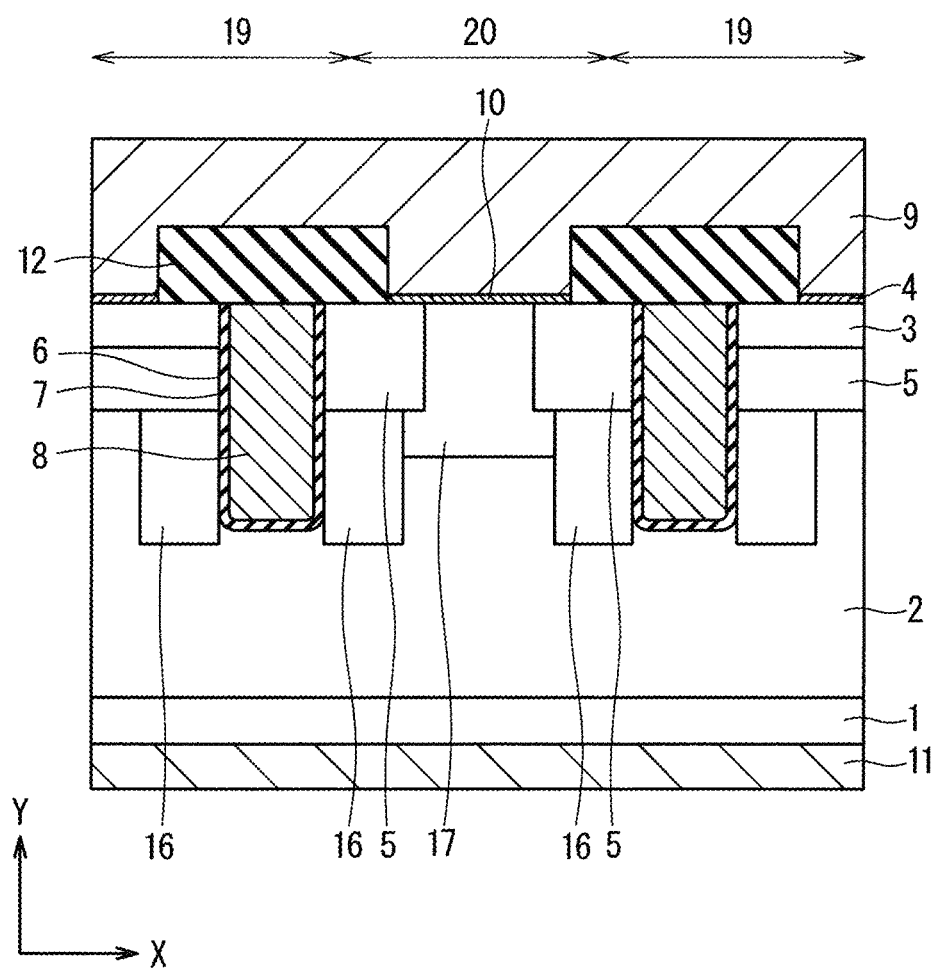
FIG. 20 is a partial sectional view illustrating a configuration of a silicon carbide semiconductor device according to Embodiment 4 of the present invention.

FIG. 20 is a partial sectional view illustrating a configuration of a silicon carbide semiconductor device 400 according to Embodiment 4 of the present invention. In FIG. 20, constituent elements that are the same as those of the silicon carbide semiconductor device 300 described with reference to FIG. 19 are given the same reference signs, and a redundant description thereof shall be omitted.

The silicon carbide semiconductor device 400 illustrated in FIG. 20 has a configuration in which, instead of a trench-type SBD, the Schottky electrode 10 is provided on the surface of the drift layer 2 between adjacent gate trenches 6 (between gate trenches), and the low-resistance layer 17 is formed in contact with the Schottky electrode 10 in the upper layer portion of the drift layer 2 under the Schottky electrode 10.

The low-resistance layer 17 is formed by techniques such as ion implantation before the gate trenches 6 are formed by etching or other methods. In this case as well, an SBD region 20 including the SBD electrode 10 is formed between MOSFET regions 19 each including the gate trench 6, and like the MOSFET regions 19, the SBD region 20 is a region in strip form.

In the SBD regions 20, the source region 3 is not provided, and the body region 5 is provided to sandwich the low-resistance 17 in the upper layer portion of the drift layer 2. The low-resistance layer 17 is formed to a position deeper than the body region 5 and shallower than the gate trenches 6 and is also in contact with the side faces of the gate trenches 6. The low-resistance layer 16 is provided such that its one end in the depth direction (Y direction) is in contact with the lower face of the body region 5, and its other end is at a depth of the same order as or slightly deeper than the depth of the bottoms of the gate trenches 6. Although the low-resistance layer 17 is provided so as to extend between the low-resistance layers 16, the low-resistance layer 17 is formed to a depth shallower than the depth of the low-resistance layer 16.

The silicon carbide semiconductor device 400 according to Embodiment 4 of the present invention moderates the electric field applied to the vicinity of the SBD electrode at OFF state of the MOSFET because the SBD electrode 10 is formed on the surface of the drift layer 2.

Moreover, the presence of the low-resistance layer 17 formed deeper than the body region 5 facilitates current diffusion in the planar direction (X direction) in the drift layer 2 in the vicinity of the bottom of the body region 5 and improves the effect of suppressing a flow of bipolar current.

Variation 1

Figure 21:
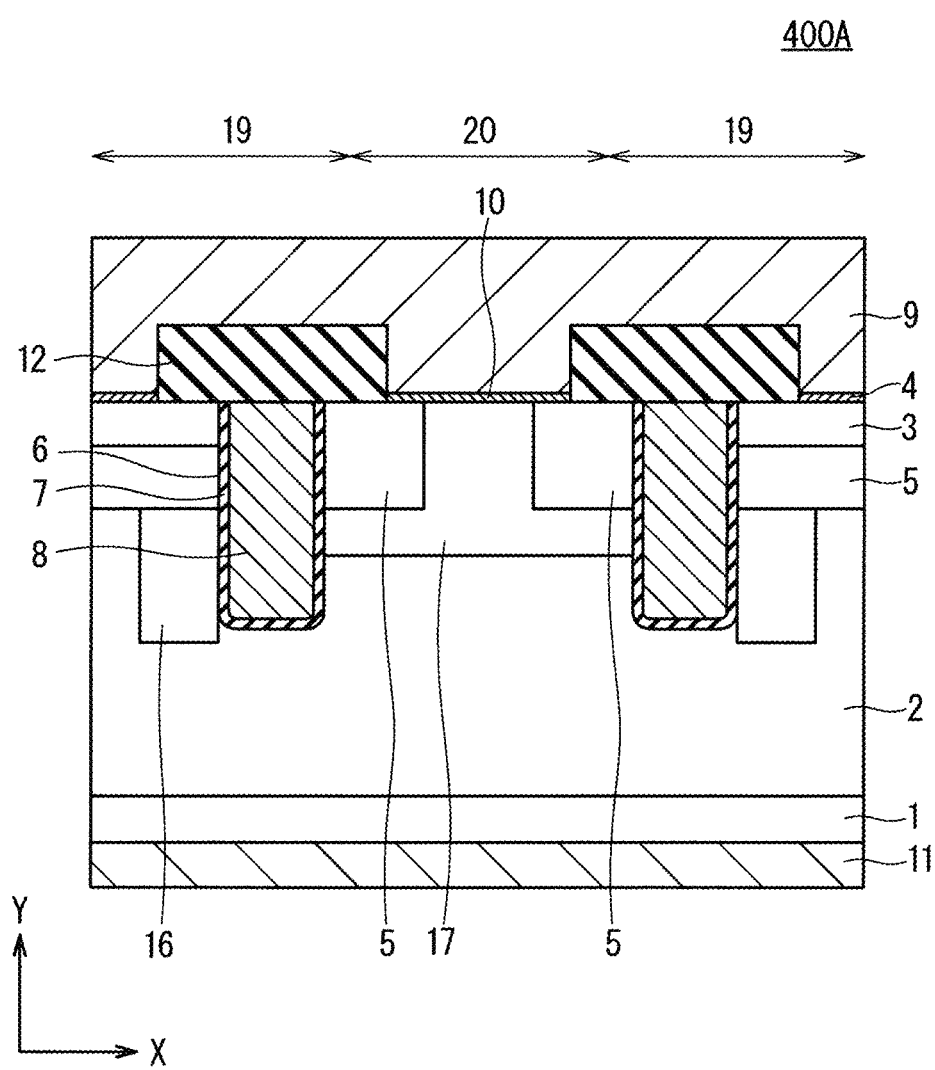
FIG. 21 is a partial sectional view illustrating a configuration of Variation 1 of the silicon carbide semiconductor device according to Embodiment 4 of the present invention.

FIG. 21 is a partial sectional view illustrating a configuration of a silicon carbide semiconductor device 400A according to Variation 1 of Embodiment 4. The silicon carbide semiconductor device 400A illustrated in FIG. 21 has a configuration in which the low-resistance layer 16 is not provided in the SBD region 20, and part of the low-resistance layer 17 is in contact with the side faces of the gate trenches 6 on both sides.

When the low-resistance layer 16 is not formed in the SBD region 20, it is possible to reduce the electric field applied to the vicinity of the SBD electrode 10 and to reduce leakage current. This is because a depletion layer can easily expand from the body region 5 toward the drift layer 2.

Variation 2

FIG. 22 is a partial sectional view illustrating a configuration of a silicon carbide semiconductor device 400B according to Variation 2 of Embodiment 4. In the silicon carbide semiconductor device 400B illustrated in FIG. 22, a low-resistance layer 21 (fourth low-resistance layer) of the first conductivity type having the same impurity concentration as the low-resistance layer 17 is formed between the gate trenches so as to come in contact with the side face of the low-resistance layer 16 and come in contact with the bottom surface of the body region 5 in the MOSFET regions 19. With this configuration, it is possible to implant ions to reach the MOSFET regions 19 without using any mask when forming the low-resistance layer 17. This eliminates the need for the step of producing a mask and accordingly reduces process costs. The presence of the low-resistance layer 21 reduces the ON-state resistance of the MOSFET, but at the same time, may increase the electric field in the gate oxide film. Thus, the impurity concentration in the low-resistance layer 21 is desirably adjusted to an appropriate concentration so that the electric field in the gate oxide film falls within tolerance. For example, the impurity concentration in the low-resistance layer 21 set to be higher than or equal to $1 \times 10^{15}$ and lower than or equal to $1 \times 10^{19}$ cm$^{-3}$.

Variation 3

FIG. 23 is a partial sectional view illustrating a configuration of a silicon carbide semiconductor device 400C according to Variation 3 of Embodiment 4. In the silicon carbide semiconductor device 400C illustrated in FIG. 23, the low-resistance layer 17 is formed to a depth shallower than the depth of the body region 5. This configuration reduces a maximum amount of unipolar current that can flow through SBDs, but can reduce electric fields applied to the vicinity of the SBD electrode 10 and the corners of the body region 5.

Variation 4

Figure 24:
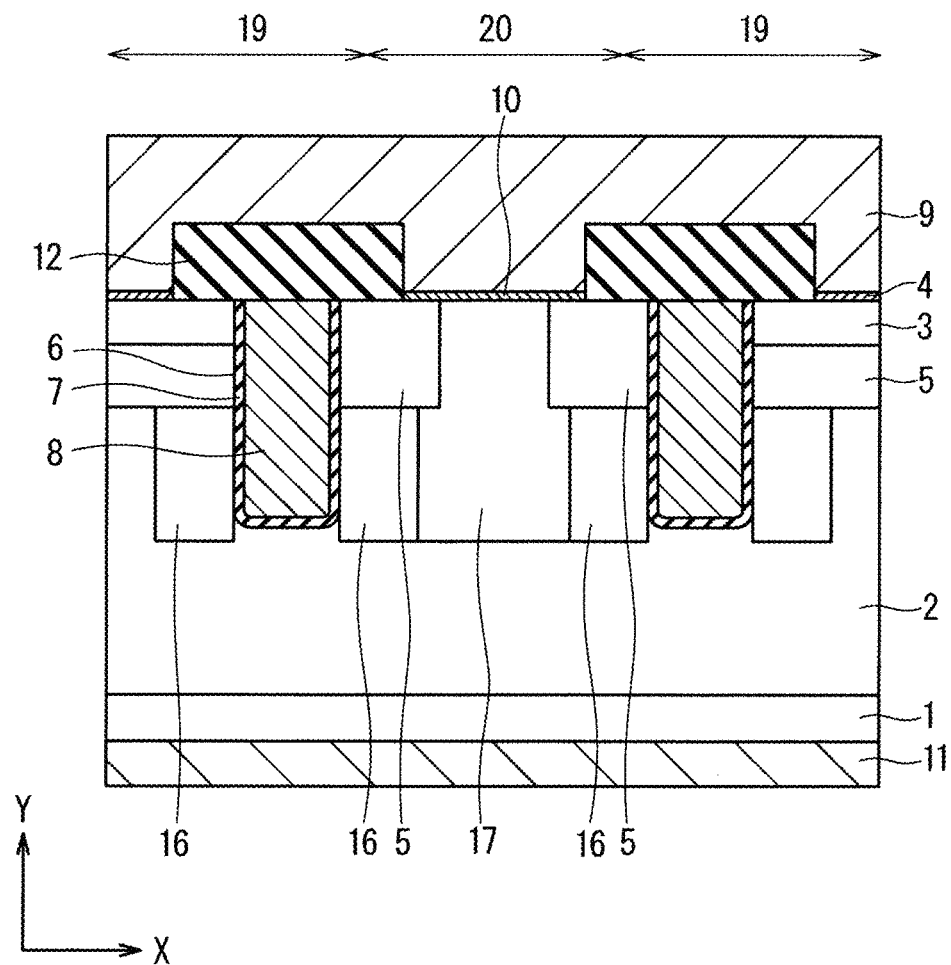
FIG. 24 is a partial sectional view illustrating a configuration of Variation 4 of the silicon carbide semiconductor device according to Embodiment 4 of the present invention.

FIG. 24 is a partial sectional view illustrating a configuration of a silicon carbide semiconductor device 400D according to Variation 4 of Embodiment 4. In the silicon carbide semiconductor device 400D illustrated in FIG. 24, the low-resistance layer 17 is formed to a position deeper than the gate trench 6. This configuration increases the maximum amount of unipolar current that can flow through SBDs.

Embodiment 5

The present embodiment applies the silicon carbide semiconductor device according to any one of the Embodiments 1 to 4 described above to a power converter. The silicon carbide semiconductor devices according to Embodiments 1 to 4 are not limited to be used as specific power converters, but the following description is given of a case as Embodiment 5 in which any of these devices is applied to a three-phase inverter.

Figure 25:
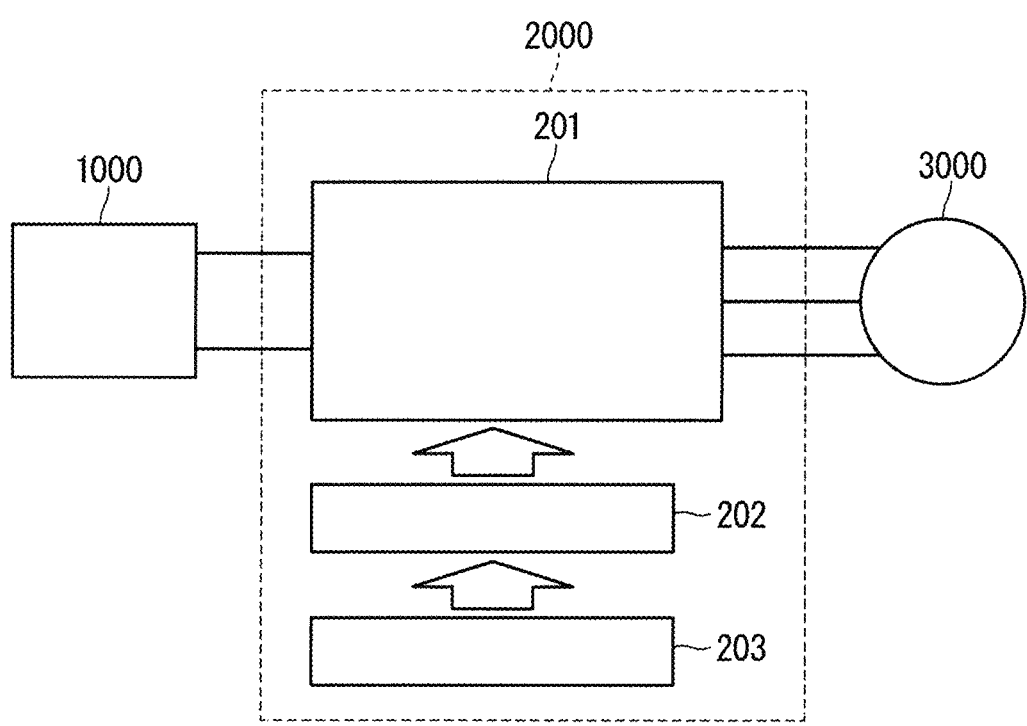
FIG. 25 is a block diagram illustrating a configuration of a power conversion system according to Embodiment 5 of the present invention.

FIG. 25 is a block diagram illustrating a configuration of a power conversion system that applies the power converter according to Embodiment 5.

The power conversion system illustrated in FIG. 25 includes a power source 1000, a power converter 2000, and a load 3000. The power source 1000 is a direct-current power supply and supplies direct-current power to the power converter 2000. The power source 1000 may be configured in various ways, and for example, may include a direct-current system, a solar cell, and a storage battery, or may include a rectifier circuit connected to an alternating-current system and an AC/DC converter. As another alternative, the power source 1000 may be configured as a DC/DC converter that converts direct-current power output from a direct-current system into predetermined power.

The power converter 2000 is a three-phase inverter connected between the power source 1000 and the load 3000. The power converter 2000 converts direct-current power supplied from the power source 1000 into alternating-current power and supplies the alternating-current power to the load 3000. As illustrated in FIG. 25, the power converter 2000 includes a main converter circuit 201 that converts direct-current power into alternating-current power and outputs the alternating-current power, a driving circuit 202 that outputs a driving signal for driving each switching element in the main converter circuit 201, and a control circuit 203 that outputs a control signal for controlling the driving circuit 202 to the driving circuit 202.

The load 300 is a three-phase electric motor driven by the alternating-current power supplied from the power converter 2000. The load 3000 is not for specific purpose of use but is an electric motor that is mounted on various electrical devices. Thus, it is used as an electric motor for a hybrid automobile, an electric automobile, a railway vehicle, or an air conditioner.

The power converter 2000 will be described hereinafter in detail. The main converter circuit 201 includes switching elements and free-wheeling diodes (not shown) and converts direct-current power supplied from the power supply 1000 into alternating-current power and supplies the alternating-current power to the load 3000 by switching the switching elements. Although the main converter circuit 201 may come in various types of specific circuit configurations, the main converter circuit 201 according to the present embodiment is a two-level three-phase full-bridge circuit that include six switching elements and six free-wheeling diodes connected respectively in inverse-parallel to the six switching elements. The silicon carbide semiconductor device according to any one of Embodiments 1 to 4 and variations described above is applied to each switching element in the main converter circuit 201. Each two of the six switching elements are connected in series and constitute upper and lower arms, and each pair of upper and lower arms constitutes each phase (U phase, V phase, or W phase) of the full-bridge circuit. An output terminal for each pair of upper and lower arms (i.e., three output terminals of the main converter circuit 201) is connected to the load 3000.

The driving circuit 202 generates a driving signal for driving each switching element in the main converter circuit 201 and supplies the driving signal to the control electrode of the switching element in the main converter circuit 201. Specifically, in accordance with a control signal received from the control circuit 203 described later, the driving circuit outputs a driving signal for turning on each switching element or a driving signal for turning off each switching element to the control electrode of the switching element. In the case of maintaining a switching element in the ON state, the driving signal is a voltage signal (ON-state signal) higher than or equal to a threshold value of the switching element, and in the case of maintaining a switching element in the OFF state, the driving signal is a voltage signal (OFF-state signal) less than a threshold value of the switching element.

The control circuit 203 controls each switching element in the main converter circuit 201 so that desired power is supplied to the load 3000. Specifically, on the basis of the power to be supplied to the load 3000, the control circuit 203 calculates a time (turn-on time) when each switching element in the main converter circuit 201 is to be turned on. For example, the control circuit may control the main converter circuit 201 by PWM control in which the turn-on time of each switching element is modulated in accordance with the voltage to be output. Then, the control circuit outputs a control command (control signal) to the driving circuit 202 so that, at each time, an ON-state signal is output to a switching element that is to be turned on and an OFF-state signal is output to a switching element that is to be turned off. In accordance with this control signal, the driving circuit 202 outputs either an ON-state signal or an OFF-state signal as a driving signal to the control electrode of each switching element.

In the power converter according to the present embodiment, the silicon carbide semiconductor device according to any of Embodiments 1 to 4 is applied as each switching element in the main converter circuit 201. Accordingly, it is possible to achieve a power converter with low loss and high reliability in high-speed switching.

Although the present embodiment has described an example of applying the silicon carbide semiconductor device according to any of Embodiments 1 to 4 to the two-level three-phase inverter, the present invention is not intended to be limited to this example, and the silicon carbide semiconductor device is applicable to various types of power converters. Although the two-level power converter has been described in the present embodiment, the silicon carbide semiconductor device may be applied to a three-level or multilevel power converter, or may be applied to a single-phase inverter when power is supplied to a single-phase load. The present invention is also applicable to a DC/DC or AC/DC converter when power is supplied to a direct-current load or the like.

The power converter that applies the silicon carbide semiconductor device according to any of Embodiments 1 to 4 is not limited for use in the case where the load described above is an electric motor. It may be used in, for example, a power supply unit for an electric discharge machine, a laser beam machine, an induction heating cooking appliance, or a non-contact power supply system, or may also be used in a power conditioner such as a photovoltaic power generating system or a power condenser system.

While the invention has been shown and described in detail, the foregoing description is in all aspects illustrative and not restrictive. It is therefore to be understood that numerous modifications and variations can be devised without departing from the scope of the invention.

According to the present invention, the above embodiments can be arbitrarily combined, or each embodiment can be appropriately varied or omitted within the scope of the invention.

The invention claimed is:

1. A silicon carbide semiconductor device that includes a Schottky barrier diode in a field-effect transistor, the silicon carbide semiconductor device comprising:
a semiconductor layer of a first conductivity type;
a first semiconductor region of the first conductivity type provided in an upper layer portion of the semiconductor layer;
a second semiconductor region of a second conductivity type provided in contact with a bottom face of the first semiconductor region;
a first trench provided through the first semiconductor region and the second semiconductor region in a thickness direction and having a bottom face that reaches inside the semiconductor layer;
a gate electrode embedded in the first trench via a gate insulating film that covers an inner face of the first trench;
an interlayer insulation film having a contact portion above the first semiconductor region;
a first low-resistance layer of the first conductivity type provided in the semiconductor layer to have contact with at least one trench side wall of the first trench in a direction perpendicular to a direction of extension of the first trench;
a second trench provided through the second semiconductor region in the thickness direction and having a bottom face that reaches inside the semiconductor layer;
a Schottky barrier diode electrode embedded in the second trench;
a second low-resistance layer of the first conductivity type provided in the semiconductor layer to have contact with at least one trench side wall of the second trench in a direction perpendicular to a direction parallel to a direction of extension of the second trench;
a first main electrode embedded in the contact portion and covering the interlayer insulation film; and
a second main electrode provided on a main surface of the semiconductor layer on a side opposite to a side on which the first main electrode is provided,
wherein the second low-resistance layer has an impurity concentration higher than an impurity concentration in the semiconductor layer and lower than an impurity concentration in the first low-resistance layer.

2. The silicon carbide semiconductor device according to claim 1, wherein
at least one of the first low-resistance layer and the second low-resistance layer is provided to a position deeper than bottoms of the first trench and the second trench.

3. The silicon carbide semiconductor device according to claim 1, wherein
at least one of the first low-resistance layer and the second low-resistance layer is provided to a position shallower than bottoms of the first trench and the second trench.

4. The silicon carbide semiconductor device according to claim 1, wherein
at least one of the first low-resistance layer and the second low-resistance layer is provided to cover bottoms of the first trench and the second trench.

5. The silicon carbide semiconductor device according to claim 1, further comprising:
a third low-resistance layer provided in contact with a side face of at least one of the first low-resistance layer and the second low-resistance layer and having a higher impurity concentration of the first conductivity type than the first low-resistance layer and the second low-resistance layer.

6. The silicon carbide semiconductor device according to claim 1, further comprising:

a protective layer of the second conductivity type provided in contact with at least part of bottoms of the first trench and the second trench.

7. The silicon carbide semiconductor device according to claim 6, comprising:
a connection layer of the second conductivity type provided in contact with a trench side wall of the first trench on a side opposite to a side on which the first low-resistance layer is provided, and in contact with a trench side wall of the second trench on a side opposite to a side on which the second low-resistance layer is provided,
wherein the connection layer is connected to the protective layer and connected to the second semiconductor region.

8. The silicon carbide semiconductor device according to claim 7, wherein
the first trench and the second trench are arranged side by side, and
the connection layer provided in contact with the trench side wall of the first trench and the connection layer provided in contact with the trench side wall of the second trench are arranged facing each other.

9. The silicon carbide semiconductor device according to claim 1, wherein
the first low-resistance layer and the second low-resistance layer are arranged with side faces having contact with each other on sides opposite to sides on which the first low-resistance layer and the second low-resistance layer are respectively in contact with the first trench and the second trench.

10. A silicon carbide semiconductor device that includes a Schottky barrier diode in a field-effect transistor, the silicon carbide semiconductor device comprising:
a semiconductor layer of a first conductivity type;
a first semiconductor region of the first conductivity type provided in an upper layer portion of the semiconductor layer;
a second semiconductor region of a second conductivity type provided with at least part of the second semiconductor region being in contact with a bottom face of the first semiconductor region and at least part of the second semiconductor region being provided in an upper layer portion of the semiconductor layer;
a plurality of trenches provided in parallel with one another through the first semiconductor region and the second semiconductor region in a depth direction, and each having a bottom face that reaches inside the semiconductor layer;
a gate electrode embedded in the plurality of trenches via a gate insulating film that covers inner faces of the plurality of trenches;
an interlayer insulation film having a contact portion above the first semiconductor region;
a first low-resistance layer of the first conductivity type provided in the semiconductor layer to have contact with at least one trench side walls of the plurality of trenches in a direction perpendicular to a direction of extension of the plurality of trenches;
a Schottky barrier diode electrode provided on the semiconductor layer between each adjacent pair of the plurality of trenches;
a second low-resistance layer of the first conductivity type provided in an upper layer portion of the semiconductor layer formed between each adjacent pair of the plurality of trenches to have contact with the Schottky barrier diode electrode;
a first main electrode covering the interlayer insulation film and embedded in the contact portion; and
a second main electrode provided on a main surface of the semiconductor layer on a side opposite to a side on which the first main electrode is provided,
wherein the second semiconductor region provided in the upper layer portion of the semiconductor layer is provided to sandwich the second low-resistance layer between the adjacent pair of the plurality of trenches, and
the second low-resistance layer has an impurity concentration higher than an impurity concentration of the semiconductor layer and lower than an impurity concentration of the first low-resistance layer.

11. The silicon carbide semiconductor device according to claim 10, wherein
the first low-resistance layer is provided to a position deeper than bottoms of the plurality of trenches, and
the second low-resistance layer is provided to a position deeper than a bottom of the second semiconductor region.

12. The silicon carbide semiconductor device according to claim 10, wherein
the first low-resistance layer is provided to a position deeper than bottoms of the plurality of trenches, and
the second low-resistance layer is provided to a position shallower than a bottom of the second semiconductor region.

13. The silicon carbide semiconductor device according to claim 10, wherein
the first low-resistance layer is provided to a position deeper than bottoms of the plurality of trenches, and
the second low-resistance layer is provided to a position deeper than the bottoms of the plurality of trenches.

14. The silicon carbide semiconductor device according to claim 10, further comprising:
a fourth low-resistance layer of the first conductivity type provided across each adjacent pair of the plurality of trenches in contact with a side face of the first low-resistance layer and a bottom face of the second semiconductor region,
wherein the fourth low-resistance layer has same impurity concentration as the second low-resistance layer.

15. A power converter comprising:
the silicon carbide semiconductor device according to claim 1;
a main converter circuit that converts input power and outputs converted power;
a driving circuit that outputs a driving signal for use in driving the silicon carbide semiconductor device to the silicon carbide semiconductor device; and
a control circuit that outputs a control signal for use in controlling the driving circuit to the driving circuit.

16. A power converter comprising:
the silicon carbide semiconductor device according to claim 10;
a main converter circuit that converts input power and outputs converted power;
a driving circuit that outputs a driving signal for use in driving the silicon carbide semiconductor device to the silicon carbide semiconductor device; and
a control circuit that outputs a control signal for use in controlling the driving circuit to the driving circuit.

* * * * *

UNITED STATES PATENT AND TRADEMARK OFFICE
CERTIFICATE OF CORRECTION

| | |
|---|---|
| PATENT NO. | : 11,894,428 B2 |
| APPLICATION NO. | : 17/427090 |
| DATED | : February 6, 2024 |
| INVENTOR(S) | : Hideyuki Hatta et al. |

It is certified that error appears in the above-identified patent and that said Letters Patent is hereby corrected as shown below:

In the Specification

Column 3, Lines 35-37, "a direction perpendicular to a direction perpendicular to a direction parallel" should read --a direction perpendicular to a direction parallel--.

Signed and Sealed this
Thirtieth Day of April, 2024

Katherine Kelly Vidal
*Director of the United States Patent and Trademark Office*